(12) United States Patent
Kim et al.

(10) Patent No.: US 12,256,486 B2
(45) Date of Patent: Mar. 18, 2025

(54) SHIELD STRUCTURE IN ELECTRONIC DEVICE AND OPERATION METHOD THEREOF

(71) Applicant: SAMSUNG ELECTRONICS CO., LTD., Suwon-si (KR)

(72) Inventors: Jonghyuk Kim, Suwon-si (KR); Sangdeok Lee, Suwon-si (KR); Woosung Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 197 days.

(21) Appl. No.: 18/115,992

(22) Filed: Mar. 1, 2023

(65) Prior Publication Data

US 2023/0209700 A1    Jun. 29, 2023

Related U.S. Application Data

(63) Continuation of application No. PCT/KR2022/007953, filed on Jun. 3, 2022.

(30) Foreign Application Priority Data

Jun. 4, 2021   (KR) .................. 10-2021-0072898

(51) Int. Cl.
*H05K 1/02* (2006.01)
*H05K 1/18* (2006.01)
*H05K 9/00* (2006.01)

(52) U.S. Cl.
CPC ........... *H05K 1/0216* (2013.01); *H05K 1/181* (2013.01); *H05K 9/0024* (2013.01); *H05K 2201/10053* (2013.01); *H05K 2201/1006* (2013.01)

(58) Field of Classification Search
CPC .... H05K 1/0216; H05K 1/181; H05K 9/0024; H05K 2201/1006
(Continued)

(56) References Cited

U.S. PATENT DOCUMENTS 6,844,236 B2    1/2005   Ivanov et al.
7,715,203 B2    5/2010   Choi
(Continued)

FOREIGN PATENT DOCUMENTS

CN   103219295   7/2013
CN   109803523   1/2021
(Continued)

OTHER PUBLICATIONS

Extended European Search Report dated Jul. 19, 2024 issued in European Patent Application No. 22816506.4.
(Continued)

*Primary Examiner* — Andargie M Aychillhum
(74) *Attorney, Agent, or Firm* — Nixon & Vanderhye, P.C.

(57) ABSTRACT

Various embodiments of the present disclosure relate to a package structure capable of allowing a shield used for noise attenuation to be used for other purposes, in an electronic device in which components are arranged at high density, and an operation method for preventing/reducing noise radiation or detecting in advance defects in a manufacturing process using the same. For this, an electronic device may include: a printed circuit board (PCB), and a package disposed on the printed circuit board. The package may include: a ground pad and at least one shield pad connected to the printed circuit board, a laminated structure comprising a plurality of laminated ground layers electrically connected to the ground pad by at least one via hole, at least one electronic component disposed on an uppermost surface of
(Continued)

the plurality of laminated ground layers, a shield covering the at least one electronic component, wherein the at least one component is not exposed to the outside, and at least one switch device comprising a switch including a first terminal electrically connected to the shield through a first conductor wiring, a second terminal electrically connected to one of the plurality of ground layers through a second conductor wiring, and a third terminal electrically connected to the shield pad through a third conductor wiring and disposed on the uppermost surface and configured to selectively connect the first terminal to the second terminal or the third terminal wherein the shield is connected to one of the one ground layer or the shield pad.

20 Claims, 26 Drawing Sheets

(58) Field of Classification Search
USPC .......................................................... 361/760
See application file for complete search history.

(56) References Cited

U.S. PATENT DOCUMENTS

| | | | |
|---|---|---|---|
| 7,723,836 | B2 | 5/2010 | Kwon et al. |
| 10,667,382 | B2 | 5/2020 | Kim |
| 2003/0122495 | A1 | 7/2003 | Nakanishi |
| 2008/0073586 | A1* | 3/2008 | Iwasaki ............... G01N 23/2251 |
| | | | 250/492.21 |
| 2011/0248389 | A1 | 10/2011 | Yorita et al. |
| 2012/0320558 | A1 | 12/2012 | Foster et al. |
| 2014/0145883 | A1* | 5/2014 | Baks ....................... H01L 23/66 |
| | | | 343/700 MS |
| 2015/0129874 | A1 | 5/2015 | Choi et al. |
| 2016/0276288 | A1 | 9/2016 | Lee et al. |
| 2017/0179039 | A1 | 6/2017 | Lee et al. |
| 2017/0290143 | A1 | 10/2017 | Ito |
| 2017/0338179 | A1 | 11/2017 | Thadesar et al. |
| 2018/0026022 | A1 | 1/2018 | Lee et al. |
| 2019/0074251 | A1 | 3/2019 | Kang et al. |
| 2019/0174627 | A1 | 6/2019 | Matsushita et al. |
| 2020/0113090 | A1 | 4/2020 | McGhee |
| 2022/0141950 | A1 | 5/2022 | Wang et al. |

FOREIGN PATENT DOCUMENTS

| | | |
|---|---|---|
| JP | 2007-180071 | 7/2007 |
| JP | 2008-244289 | 10/2008 |
| JP | 2009-218258 | 9/2009 |
| JP | 2011-187779 | 9/2011 |
| JP | 2014-183181 | 9/2014 |
| KR | 10-1999-0070277 | 9/1999 |
| KR | 10-2001-0054515 | 7/2001 |
| KR | 20-0293458 | 10/2002 |
| KR | 10-2003-0011583 | 2/2003 |
| KR | 10-2005-0068930 | 7/2005 |
| KR | 10-0714917 | 5/2007 |
| KR | 10-2019-0025363 | 3/2019 |
| KR | 10-1961316 | 3/2019 |

OTHER PUBLICATIONS

International Search Report for PCT/KR2022/007953, mailed Nov. 24, 2022, 7 pages.

Written Opinion of the ISA for PCT/KR2022/007953, mailed Nov. 24, 2022, 4 pages.

* cited by examiner

SHIELD STRUCTURE IN ELECTRONIC DEVICE AND OPERATION METHOD THEREOF

CROSS-REFERENCE TO RELATED APPLICATIONS

This application is a continuation of International Application No. PCT/KR2022/007953 designating the United States, filed on Jun. 3, 2022, in the Korean Intellectual Property Receiving Office and claiming priority to Korean Patent Application No. 10-2021-0072898, filed on Jun. 4, 2021, in the Korean Intellectual Property Office, the disclosures of which are incorporated by reference herein in their entireties.

BACKGROUND

Field

The disclosure relates to a shield structure in an electronic device and an operation method thereof.

Description of Related Art

To meet an increasing traffic demand after the commercialization of a 4th-generation (4G) communication system, the development of a 5th-generation (5G) communication system or a pre-5G communication system (hereinafter, commonly referred to as a '5G communication system') was made. The 5G communication system is called a beyond 4G network communication system or a post long term evolution (post LTE) system.

The 5G communication system can utilize a high frequency (mmWave) band (for example, a band of 6 GHz or more) in order to provide a higher data rate than that of the 4G communication system. The 5G communication system can have a high attenuation characteristic (e.g., about 20 to 30 dB attenuation) compared to a communication system (e.g., the 4G communication system) that uses a relatively low frequency band (within 6 GHz).

To address this problem, the 5G communication system can employ beam-forming, massive MIMO, full dimensional MIMO (FD-MIMO), an array antenna, analog beam-forming, and large scale antenna technology.

An electronic device can include a shield. The shield can generally play a role of preventing/reducing a noise generated within a component from going outside or preventing/reducing an external noise from entering inside. The shield can be strongly connected to the ground (hereinafter, GND) of the inside (e.g., mainly a laminate, or a substrate such as a printed circuit board (PCB), etc.) of a component, thereby effectively attenuating the external noise.

To support various functions such as wireless communication in a heterogeneous network, the type and number of components in an electronic device can increase. Accordingly, many components can be disposed at high density or components sensitive to a high power and/or noise can be disposed in the electronic device. In this case, a signal interference or defect can occur in the electronic device due to an unwanted noise between the components.

SUMMARY

Embodiments of the disclosure may provide a shield structure for enabling a shield used for noise reduction to be utilized for other purposes in an electronic device in which a plurality of components are disposed, and an operation method using the same.

According to an example embodiment, an electronic device may include: a printed circuit board (PCB), and a package disposed on the printed circuit board. The package may include: a ground pad and at least one shield pad disposed to be soldered onto the printed circuit board, a laminated structure in which a plurality of ground layers are laminated to be electrically connected to the ground pad by at least one via hole, at least one component disposed on an uppermost surface on which the plurality of ground layers are laminated, a shield covering the at least one component wherein the at least one component is not exposed to the outside, and at least one switch device including a first terminal electrically connected to the shield through a first conductor wiring, a second terminal electrically connected to one of the plurality of ground layers through a second conductor wiring, and a third terminal electrically connected to the shield pad through a third conductor wiring, and disposed on the uppermost surface on which the plurality of ground layers are laminated to selectively connect the first terminal to the second terminal or the third terminal wherein the shield is connected to one of the one ground layer or the shield pad.

In any example implementation described in the present disclosure, two or more physically separate components may alternatively be integrated into a single component when their integration is possible, and the integration is possible when the same function is performed by the so formed single component. Moreover, a single component of any embodiment described in the present disclosure may alternatively be implemented with two or more separate components achieving the same function, where appropriate.

An electronic device of various example embodiments may prevent and/or reduce noise radiation of a terminal by expanding the use of a shield, reduce a cost by detecting defects in a manufacturing process, and decrease the effect of noise between components arranged at high density.

Effects obtainable in the present disclosure are not limited to the above-mentioned effects, and other effects not mentioned may be clearly understood by those having an ordinary skill in the art to which the present disclosure belongs from the description below.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Hereinafter, various example embodiments will be described in greater detail with reference to the accompanying drawings. In the following description, specific details, such as detailed constructions and components, will be presented merely to aid a general understanding of the present disclosure. Accordingly, it should be apparent to those skilled in the art that various changes and modifications may be made without departing from the scope and spirit of the present disclosure. Also, descriptions of well-known functions and constructions may be omitted for clarity and brevity.

Figure 1:
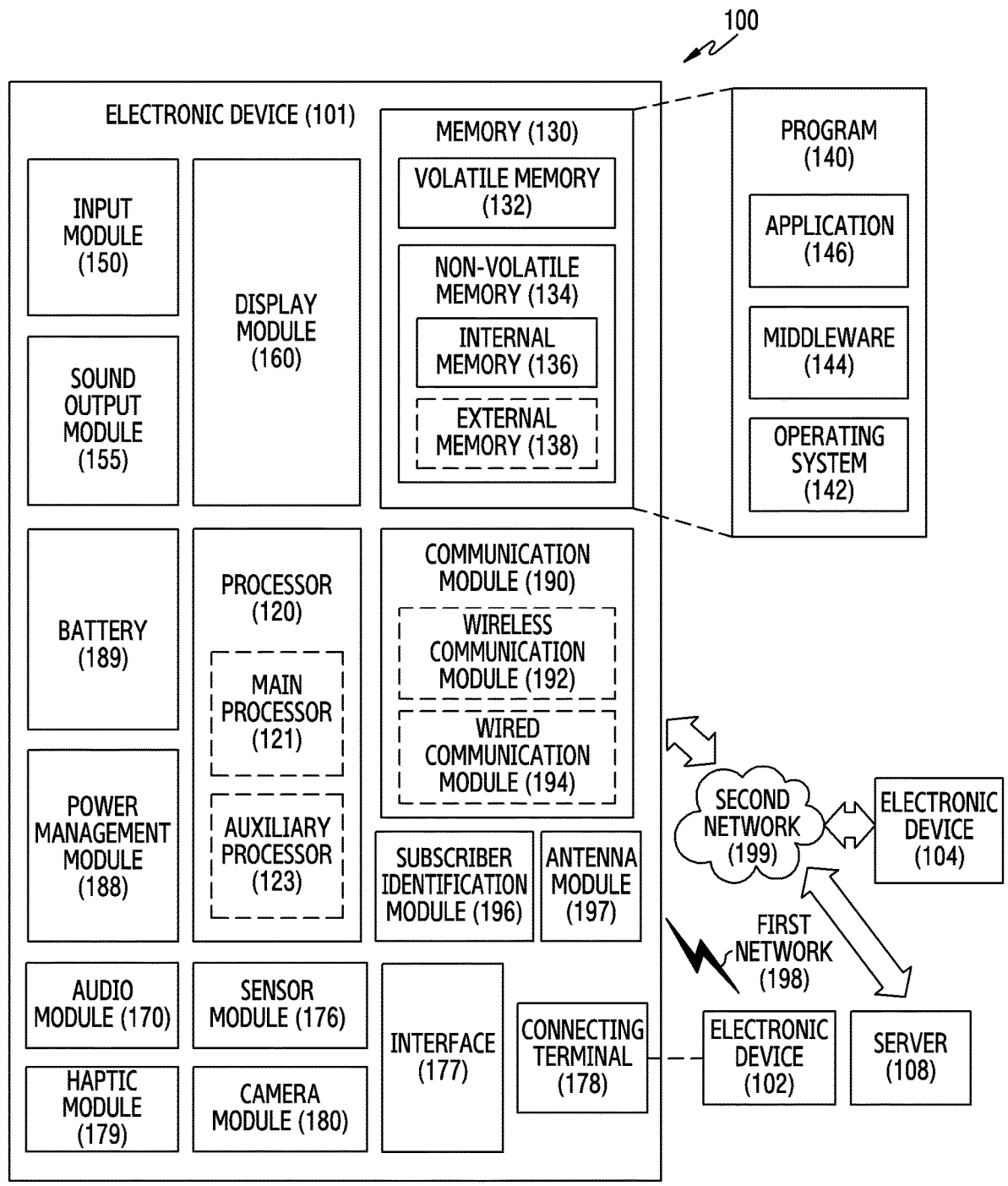
FIG. 1 is a block diagram of illustrating an example electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
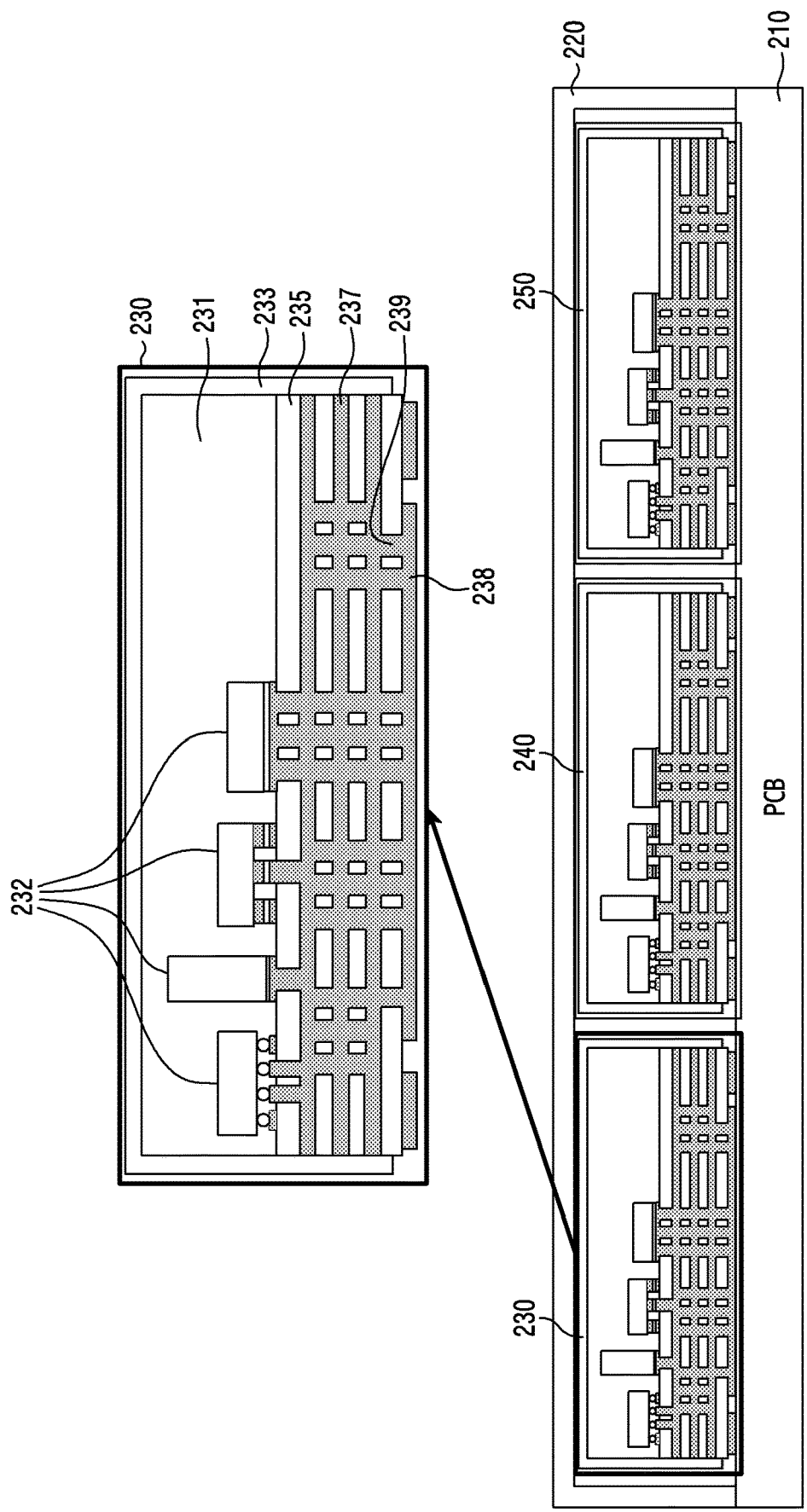
FIG. 2 is a diagram illustrating an example package for shielding internal components in an electronic device and an arrangement structure of the package according to various embodiments.

FIG. 2 is a diagram illustrating an example package for shielding internal components in an electronic device (e.g., the electronic device 101 of FIG. 1) and an arrangement structure of the package according to various embodiments.

Referring to FIG. 2, the electronic device 101 of an embodiment may include one or a plurality of packages (e.g., a first package 230, a second package 240, and a third package 250) for protecting at least one component 232 disposed therein using a shield.

According to an embodiment, the at least one component 232 may be integrated at high density in a predetermined space inside the package. For example, the at least one component 232 may include components such as a power amplifier (PA) and/or a low noise amplifier (LNA).

According to an embodiment, the shield may be included in the package, to block or reduce that a noise provided inside the package goes out or that a noise provided outside comes inside the package. In an embodiment, the one or plurality of packages 230, 240, and 250 may be disposed on one surface of a PCB 210. In an embodiment, the one or plurality of packages 230, 240, and 250 disposed on the PCB 210 may be covered by a shield can 220.

According to an embodiment, the one or plurality of packages 230, 240, and 250 may include a structure (hereinafter, referred to as a 'laminated structure') in which ground layers 237 comprising a conductor and insulating layers 235 comprising an insulator between the ground layers 237 are laminated.

According to an embodiment, the ground layers 237 laminated in the laminated structure may be electrically connected to a ground pad (GND pad) 238 by a layer connection via 239. The ground pad 238 may be soldered to one surface of the PCB 210, thereby being grounded with the ground of the electronic device 101.

According to an embodiment, the shield 233 may be configured to cover components disposed on one surface of the laminated structure so as not to be exposed to the outside. For example, the shield 233 may have a hexahedral box model without a bottom surface, and may be formed to cover components disposed in the first package 230. For example, the shield 233 may be formed to surround the first package 230 excluding the ground pad (GND PAD) 238. The shield 233 may be electrically connected to at least one ground layer 237 exposed to the outside among the ground layers 237 of the laminated structure. In an embodiment, a space 231 existing between the shield 233 and one surface of the laminated structure on which the internal components of the first package 230 are disposed may be filled with a predetermined (e.g., specified) material. The predetermined material may include, for example, an insulating member.

According to an embodiment, the shield 233 may be a hexahedral box model as an example, but is not limited thereto. For example, the shield 233 may be formed in a hemispherical box shape.

According to an embodiment, the ground layers 237 are electrically connected to the ground pad 238 by the layer connection via 239, whereby the shield 233 may be strongly connected to the ground pad 238 of the electronic device 101.

According to an embodiment, the shield 233 may include a conductive material such as metal.

According to an embodiment, the shield 233 may play a role of absorbing a noise provided due to the components included in the first package 230 and forwarding the same to the ground, thereby reducing a radiation or leakage of the noise provided inside.

In the above disclosure, the structure of the first package 230 has been described, but the second package 240 and the third package 250, which are the remaining packages disposed within the shield can 220, may also have the same or similar structure.

Figure 3:
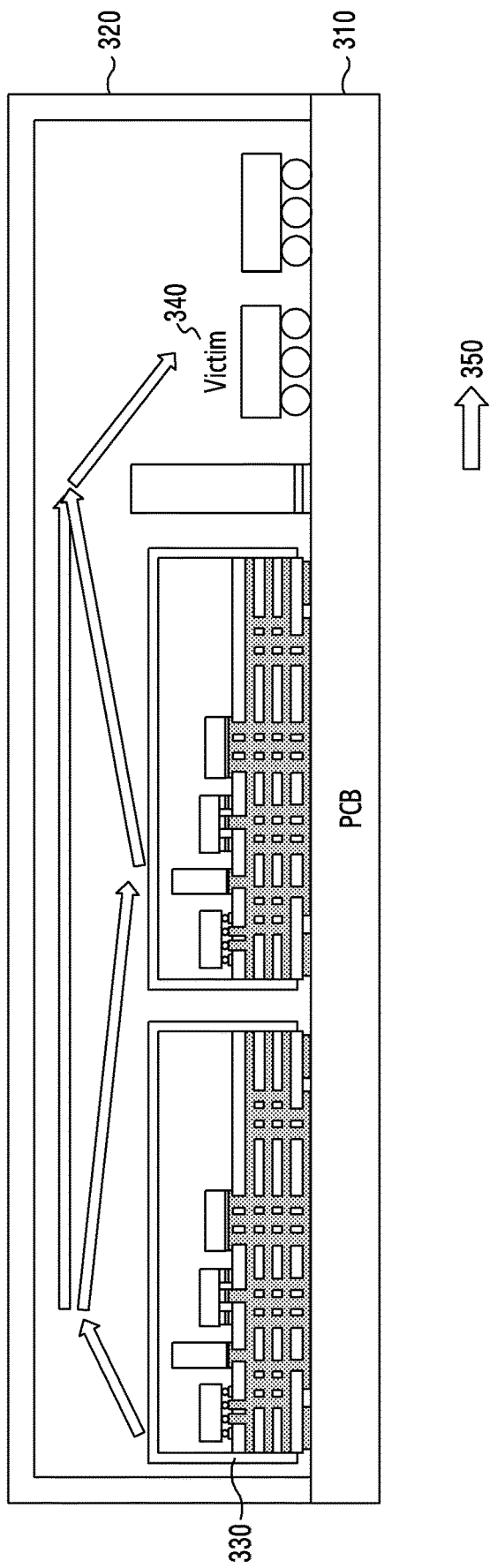
FIG. 3 is a diagram illustrating an example noise path resulting from radiation within a shield can included in an electronic device according to various embodiments.

FIG. 3 is a diagram illustrating an example noise path resulting from radiation within a shield can included in an electronic device (e.g., the electronic device 101 of FIG. 1) according to various embodiments.

Referring to FIG. 3, a component (hereinafter, referred to as an "aggressor component") 330 radiating a signal capable of becoming a noise with respect to other components (hereinafter, referred to as a "victim component") 340 may be included within the shield can 320 (e.g., the shield can 220 of FIG. 2).

According to an embodiment, the aggressor component 330 may be a component that provides a noise, and the victim component 340 may be a component that is undesirably affected by the noise provided by the aggressor component. In an example, the victim component 340 may be a component not protected by the shield among the components existing within the shield can 320.

According to an embodiment, the victim component 340 may be a component used as a single unit such as an LC (inductor, capacitor), a band pass filter (BPF), or a PA.

According to an embodiment, the component used as the single unit may not be easy to cover (or shield) in structure. In this case, according to an embodiment, the noise provided by the aggressor component 330 may be forwarded to a component disposed next to it as a single unit, or be forwarded even to a distant component in that a space between a package and the shield can 320 forms a noise propagation path 350 like a waveguide.

According to an embodiment, this forwarded noise may have an unwanted influence on the victim component 340.

As a way to address the above-described problem, a distance between the aggressor component 330 and the victim component 340 may be spaced enough not to affect, or a shield wall may be erected between the aggressor component 330 and the victim component 340. However, according to an embodiment, this may cause a loss in an internal space of the electronic device 101.

Figure 4:
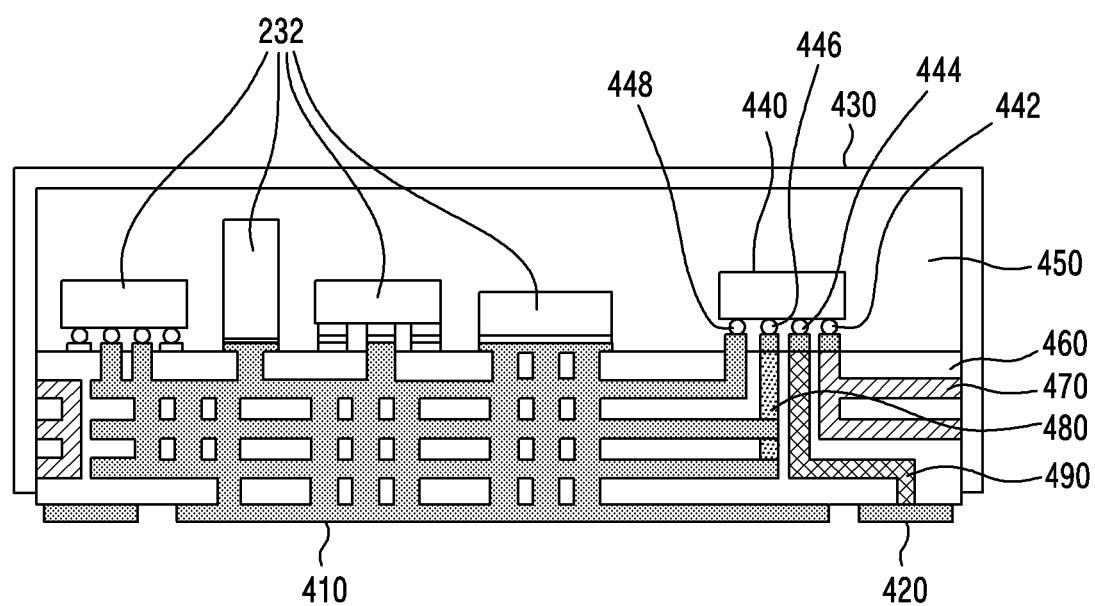
FIG. 4 is a cross-sectional view of a package illustrating an example package structure in an electronic device according to various embodiments.

FIG. 4 is a cross-sectional view of a package structure in an electronic device (e.g., the electronic device 101 of FIG. 1) according to various embodiments.

Referring to FIG. 4, one package of an embodiment may include a ground pad 410, a shield pad 420, a laminated structure in which a plurality of layers are laminated, at least one component (or device) disposed on one surface of the laminated structure, a shield switch 440 and/or a shield 430.

According to an embodiment, the plurality of layers may have a structure in which a plurality of ground layers (represented by dots in the drawing) and insulating layers 460 made of an insulator between the ground layers are laminated.

According to an embodiment, the ground layers may be electrically connected to the ground pad 410 through a via.

According to an embodiment, the at least one component (e.g., a switch, an LC, a BPF, or a PA) may be electrically connected to the ground layers through a via. Accordingly, in an example, the at least one component may be electrically connected to the ground pad 410 through a via.

According to an embodiment, the ground pad 410 and/or the shield pad 420 may be disposed to be soldered to a PCB (e.g., the PCB 210 of FIG. 2 or the PCB 310 of FIG. 3). For example, the shield pad 420 may be electrically connected to the ground layer of the PCB.

According to an embodiment, the shield switch 440 may include four terminals (or ports). In the following description, the shield switch 440 is described as including four terminals, but the scope of the present disclosure is not limited thereto, and may include fewer or more than four terminals.

According to an embodiment, a first terminal 442 among the four terminals included in the shield switch 440 may be electrically connected to the shield 430 through a first conductor wiring 470. According to an embodiment, a third terminal 446 among the four terminals included in the shield switch 440 may be electrically connected to the ground layer through a second conductor wiring 480. According to an embodiment, a second terminal 444 among the four terminals included in the shield switch 440 may be electrically connected to the shield pad 420 through a third conductor wiring 490. According to an embodiment, a fourth terminal 448 among the four terminals included in the shield switch 440 may be electrically directly connected to the ground layer.

According to an embodiment, the first terminal 442 may perform a role of enabling a component to operate in a shielded state by connecting the shield 430 to the first conductor wiring 470. According to an embodiment, the second terminal 444 may enable the shield 430 to be connected to the shield pad 420 through the third conductor wiring 490. According to an embodiment, the fourth terminal 448 may perform a role of a ground connection port for an operation of at least one component.

According to an embodiment, the shield switch 440 may electrically connect the first terminal 442 to the third terminal 446, or electrically connect the first terminal 442 to the second terminal 444.

According to an embodiment, when the shield switch 440 electrically connects the first terminal 442 to the third terminal 446, the shield 430 may be electrically connected to the ground layer through the second conductor wiring 480. According to an embodiment, when the shield switch 440 connects the first terminal 442 to the second terminal 444, the shield 430 may be electrically connected to the shield pad 420 through the third conductor wiring 490.

According to an embodiment, the shield switch 440 may, for example, include one or a plurality of switch devices (e.g., switches).

Figure 5:
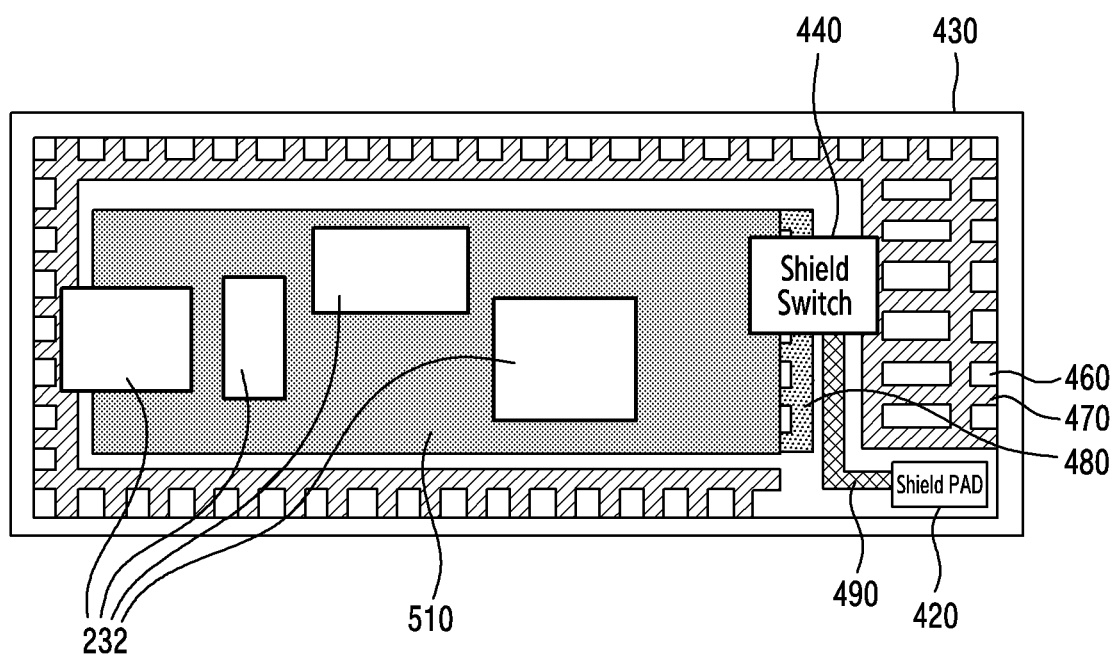
FIG. 5 is a diagram illustrating an example package structure in an electronic device according to various embodiments.

FIG. 5 is a diagram illustrating a package structure in an electronic device (e.g., the electronic device 101 of FIG. 1) according to various embodiments.

Referring to FIG. 5, the at least one component 232 and the shield switch 440 surrounded by the shield 430 may be disposed in one package of an embodiment.

According to an embodiment, the at least one component 232 may include a first component, a second component, a third component, and/or a fourth component. In an example, the first component, the second component, the third component, or the fourth component may be a switch, an LC, a BPF or a PA.

In the following description, one package is described as including four components, but an embodiment of the present disclosure is not limited thereto, and may include more or fewer than four components.

According to an embodiment, the shield switch 440 may be electrically connected to the shield 430 by the first conductor wiring 470 hatched in FIG. 5, and may be electrically connected to the ground pad 410 by the second conductor wiring 480 indicated by dots in FIG. 5, and may be electrically connected to the shield pad 420 by the third conductor wiring 490 indicated by cross-hatching in FIG. 5.

In an embodiment, the third conductor wiring 490 may be formed to surround at least one component and/or at least a part of the shield switch 440, when viewed from above one surface of the package. For another example, the third conductor wiring 490 may be electrically connected to the shield 430 using a plurality of contacts. For further example, the third conductor wiring 490 may be formed so as not to overlap with the ground layer, when viewed from above one surface of the package.

In FIG. 4 and FIG. 5, the package structure in the electronic device 101 may include the shield switch 440 operating to selectively electrically connect the shield 430 to the ground pad 410 or the shield pad 420. In an embodiment, in a first operation state of the shield switch 440 through which the shield 430 and the ground pad 410 are connected, the shield 430 may operate for noise attenuation. For another example, in a second operation state of the shield switch 440 through which the shield 430 and the shield pad 420 are connected, the shield 430 may operate for other purposes.

Figure 6:
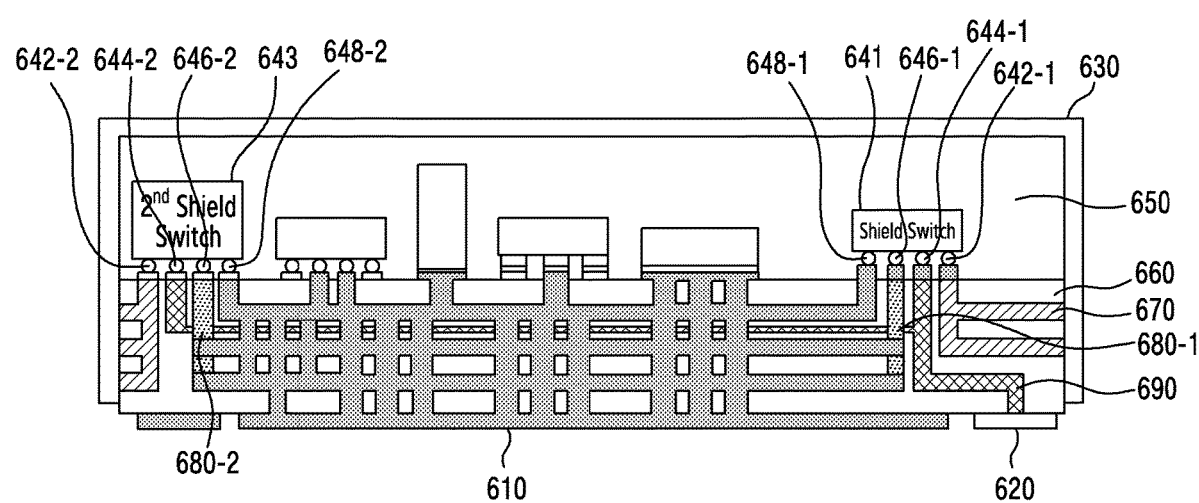
FIG. 6 is a cross-sectional view of a package structure in an electronic device according to various embodiments.

FIG. 6 is a cross-sectional view of a package structure in an electronic device (e.g., the electronic device 101 of FIG. 1) according to various embodiments.

Referring to FIG. 6, one package of an embodiment may include a ground pad 610, a shield pad 620, a laminated structure, at least one component (or device) (e.g., a switch, an LC, a BPF or a PA) disposed on one surface of the laminated structure, a first shield switch 641, a second shield switch 643 and/or a shield 630.

According to an embodiment, each of the first or second shield switch 641 or 643 may include four terminals (or ports).

In the following description, each of the first or second shield switch 641 or 643 has been described as including four terminals, but this is only an example, and each of the first or second shield switch 641 or 643 may include more or fewer than four terminals.

According to an embodiment, first terminals 642-1 and 642-2 among the four terminals included in the first or second shield switch 641 or 643 may be electrically connected to a shield 630 through a first conductor wiring 670. According to an embodiment, third terminals 646-1 and 646-2 among the four terminals included in the first or second shield switch 641 or 643 may be electrically connected to a ground layer through second conductor wirings 680-1 and 680-2. According to an embodiment, second terminals 644-1 and 644-2 among the four terminals included in the first or second shield switch 641 or 643 may be electrically connected to the shield pad 620 through a third conductor wiring 690.

For this, according to an embodiment, the second terminal 644-1 included in the first shield switch 641 and the second terminal 644-2 included in the second shield switch 643 may be electrically connected by the third conductor wiring 690.

According to an embodiment, fourth terminals 648-1 and 648-2 among the four terminals included in the first or second shield switch 641 or 643 may be electrically directly connected to the ground layer. In an embodiment, a layer of the ground layer to which the third terminals 646-1 and 646-2 are connected through the second conductor wirings 680-1 and 680-2 and a layer of the ground layer to which the fourth terminals 648-1 and 648-2 are connected may be different.

In an embodiment, the first shield switch 641 and the second shield switch 643 each may be connected to a separate shield pad (e.g., the shield pad 620).

According to an embodiment, the first or second shield switch 641 or 643 may electrically connect the first terminal 642-1 or 642-2 to the third terminal 646-1 or 646-2, or may electrically connect the first terminal 642-1 or 642-2 to the second terminal 644-1 or 644-2. In an embodiment, when the first or second shield switch 641 or 643 electrically connects the first terminal 642-1 or 642-2 to the third terminal 646-1 or 646-2, the shield 630 may be electrically connected to the ground layer through the second conductor wiring 680-1 or 680-2. For another example, when the first or second shield switch 641 or 643 electrically connects the first terminal 642-1 or 642-2 to the second terminal 644-1 or 644-2, the shield 630 may be electrically connected to the shield pad 620 through the third conductor wiring 690.

The first or second shield switch 641 or 643 may, for example, include one or a plurality of switch devices.

Figure 7:
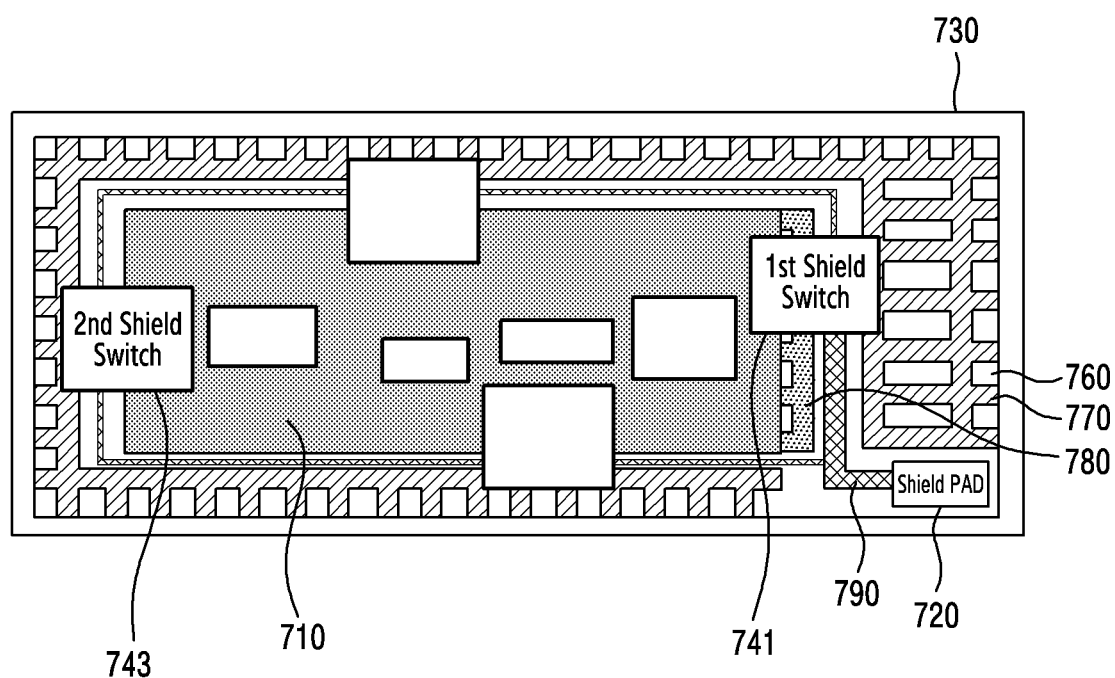
FIG. 7 is a diagram illustrating a package structure in an electronic device according to various embodiments.

FIG. 7 is a diagram illustrating a package structure in an electronic device (e.g., the electronic device 101 of FIG. 1) according to various embodiments.

Referring to FIG. 7, a plurality of components and first and second shield switches 741 and 743 surrounded by a shield 730 may be disposed in one package of an embodiment.

According to an embodiment, the first and second shield switches 741 and 743 may be electrically connected to the shield 730 by a first conductor wiring 770 hatched in FIG. 7, and may be electrically connected to a ground layer 710 by a second conductor wiring 780 indicated by dots in FIG. 7, and may be electrically connected to a shield pad 720 by a third conductor wiring 790 indicated by cross-hatching in FIG. 7.

In FIG. 6 and FIG. 7, the package structure of the electronic device 101 may include the plurality of shield switches 641 and 643 or 741 and 743. In an example, the plurality of shield switches 641 and 643 or 741 and 743 may operate to selectively electrically connect the shield 630 or 730 to the ground pad 610 or 710 or the shield pad 620 or 720.

In an embodiment, an operation state of the plurality of shield switches 641 and 643 or 741 and 743 through which the shield 630 or 730 and the ground pad 610 or 710 are connected may refer, for example, to a first operation state. In the first operation state, the shields 630 and 730 may be operated for noise attenuation. For another example, an operation state of the plurality of shield switches 641 and 643 or 741 and 743 through which the shield 630 or 730 and the shield pad 620 or 720 are connected may refer, for example, to a second operation state. In the second operation state, the shields 630 and 730 may be operated for other purposes.

Figure 8:
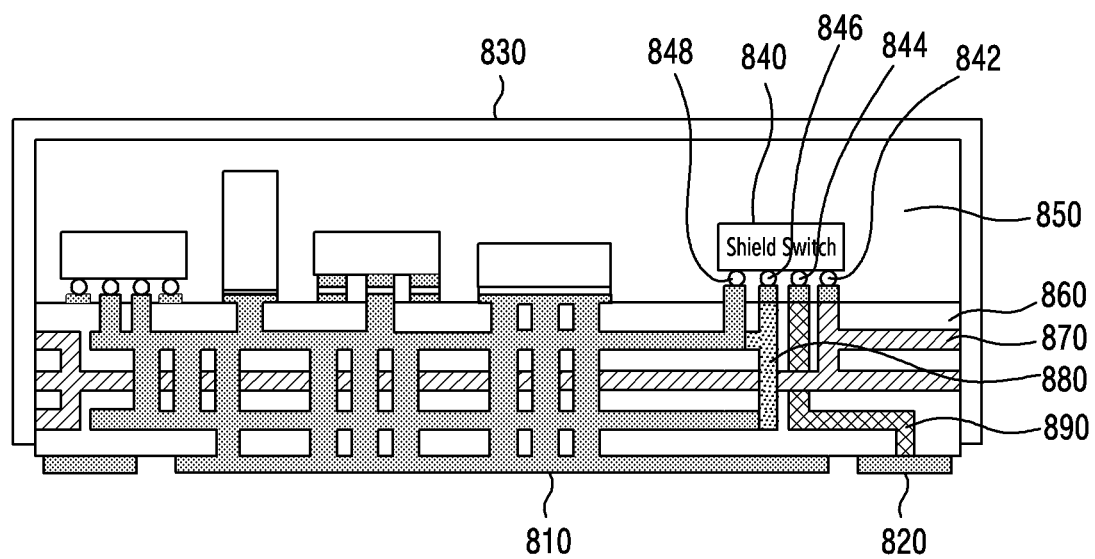
FIG. 8 is a cross-sectional view of a package structure in an electronic device according to various embodiments.

FIG. 8 is a cross-sectional view of a package structure in an electronic device (e.g., the electronic device 101 of FIG. 1) according to various embodiments.

Referring to FIG. 8, one package of an embodiment may include a ground pad 810, a shield pad 820, a laminated structure, a plurality of components (or devices) disposed on one surface of the laminated structure, and a shield switch 840 and/or a shield 830. The laminated structure may be a structure in which a plurality of ground layers (represented by dots in the drawing) and insulating layers 860 made of an insulator between the ground layers are laminated.

According to an embodiment, the ground layers may be electrically connected to the ground pad 810 through a via. In an example, the plurality of components (e.g., a switch, an LC, a BPF, and a PA) may be electrically connected to the ground layers through a via. According to an embodiment, the ground pad 810 and/or the shield pad 820 may be disposed to be electrically connected to a PCB (e.g., the PCB 210 of FIG. 2 or the PCB 310 of FIG. 3).

According to an embodiment, the shield switch 840 may include four terminals (or ports). A first terminal 842 among the four terminals included in the shield switch 840 may be electrically connected to the shield 830 through a first conductor layer 870.

According to an embodiment, since the first terminal 842 included in the shield switch 840 is connected to the shield 830 through at least one of the ground layers that are not conductor wirings, relatively strong connection may be presented compared to being connected through the conductor wiring. According to an embodiment, the components and the shield are connected through a plurality of shield switches instead of a single shield switch, connection between the shield and the ground may be strengthened. For another example, when connection is made through a conductor layer, the first terminal 842 included in the shield switch 840 may penetrate the laminated structure and be electrically connected to at least two surfaces included in the shield 830.

According to an embodiment, a third terminal 846 among the four terminals included in the shield switch 840 may be electrically connected to the ground layer through a second conductor wiring 880. According to an embodiment, a second terminal 844 among the four terminals included in the shield switch 840 may be electrically connected to the shield pad 820 through a third conductor wiring 890. According to an embodiment, a fourth terminal 848 among the four terminals included in the shield switch 840 may be electrically directly connected to the ground layer.

According to an embodiment, the shield switch 840 may electrically connect the first terminal 842 to the third terminal 846, or electrically connect the first terminal 842 to the second terminal 844. According to an embodiment, when the shield switch 840 electrically connects the first terminal 842 to the third terminal 846, the shield 830 may be electrically connected to the ground layer through the second conductor wiring 880. According to an embodiment, when the shield switch 840 electrically connects the first terminal 842 to the second terminal 844, the shield 830 may be electrically connected to the shield pad 820 through the third conductor wiring 890. The shield switch 840 may, for example, include one or a plurality of switch devices.

Figure 9:
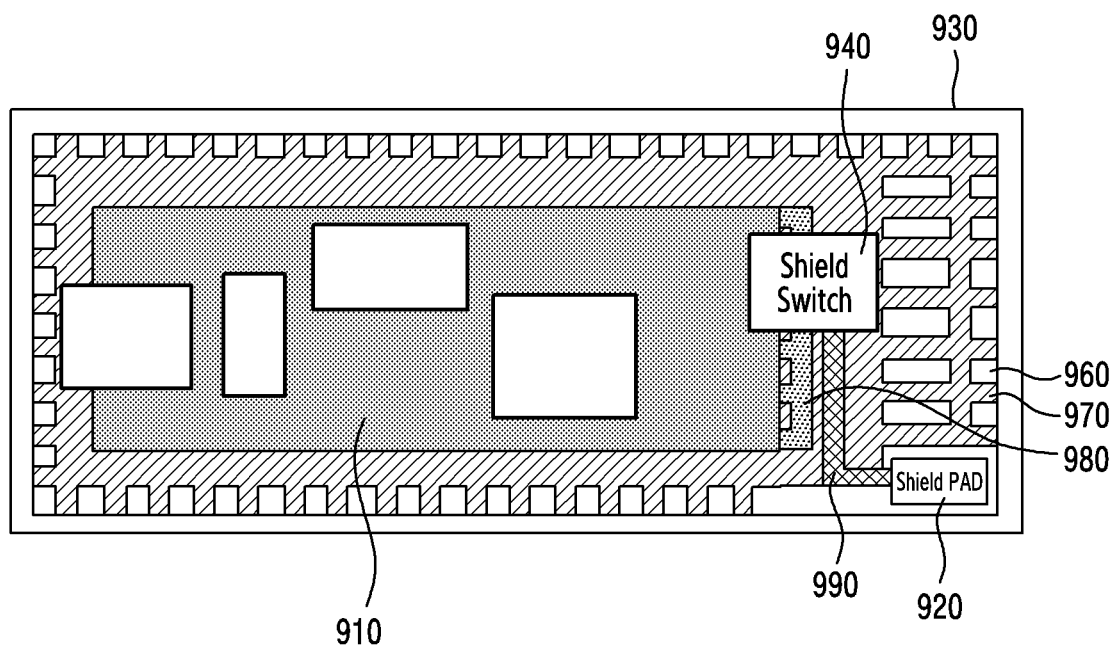
FIG. 9 is a diagram illustrating a package structure in an electronic device according to various embodiments.

FIG. 9 is a diagram illustrating a package structure in an electronic device (e.g., the electronic device 101 of FIG. 1) according to various embodiments.

Referring to FIG. 9, a plurality of components and a shield switch 940 surrounded by a shield 930 may be disposed in one package of an embodiment. The shield switch 940 may be electrically connected to at least two surfaces included in the shield 930 by a first conductor layer 970 hatched in FIG. 9, and may be electrically connected to a ground layer 910 by a second conductor wiring 980 indicated by dots in FIG. 9, and may be electrically connected to a shield pad 920 by a third conductor wiring 990 indicated by cross-hatching in FIG. 9.

In FIG. 8 and FIG. 9, the package structures of the electronic device 101 may include the shield switches 840 and 940. In an example, the shield switches 840 and 940 may operate to selectively connect the shields 830 and 930 to the ground pads 810 and 910 or the shield pads 820 and 920.

In an embodiment, in a first operation state of the shield switches 840 and 940 through which the shields 830 and 930 and the ground pads 810 and 910 are connected, the shields 830 and 930 may be operated for noise attenuation, and in a second operation state of the shield switches 840 and 940 through which the shields 830 and 930 and the shield pads 820 and 920 are connected, the shields 830 and 930 may be operated for other purposes.

Figure 10:
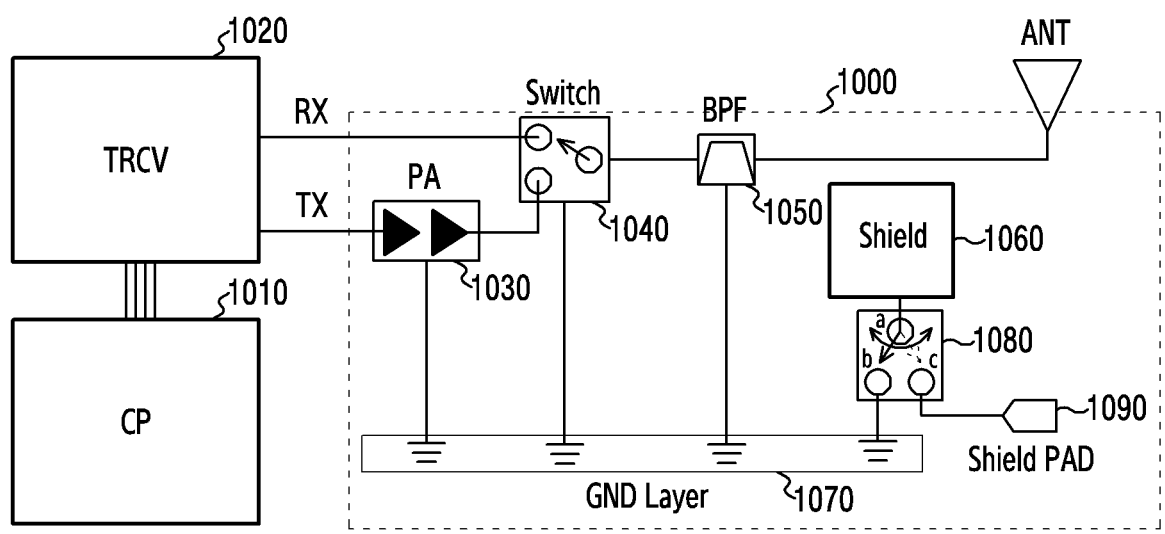
FIG. 10 is a diagram illustrating a circuit for controlling a shield path in an electronic device according to various embodiments.

FIG. 10 is a diagram illustrating a circuit for controlling a shield path in an electronic device (e.g., the electronic device 101 of FIG. 1) according to various embodiments.

Referring to FIG. 10, the electronic device 101 of an embodiment may include a processor (e.g., including processing circuitry) 1010 (e.g., the processor 120 of FIG. 1), a transceiver (TRCV) 1020, a PA 1030, a transmit/receive switch 1040, a BPF 1050, a shield 1060 (e.g., the shield 430 of FIG. 4 or the shield 830 of FIG. 8), a shield switch 1080 (e.g., the shield switch 440 of FIG. 4 or the shield switch 840 of FIG. 8), a ground layer (GND layer) 1070 (e.g., the ground pad 410 of FIG. 4 or the ground pad 810 of FIG. 8) and/or a shield pad 1090 (e.g., the shield pad 420 of FIG. 4 or the shield pad 820 of FIG. 8).

The processor 1010 may include various processing circuitry and perform a general control for transmitting and/or receiving signals. The processor 1010 may include, for example, a communication processor (CP). The processor 1010 may present a transmission signal of a baseband to be transmitted, to the transceiver 1020, or may receive a reception signal of a baseband from the transceiver 1020.

The transceiver 1020 may perform a general operation for processing a signal to be transmitted or received. The transceiver 1020 may, for example, up-convert a transmission signal of a baseband presented from the processor 1010 into a transmission signal of a radio frequency band, and output. The transceiver 1020 may down-convert a reception signal of a radio frequency band into a reception signal of a baseband, and present to the processor 1010.

The PA 1030 may amplify and output a transmission signal of a radio frequency band outputted from the transceiver 1020.

The transmit/receive switch 1040 may form a transmission path to forward a transmission signal of a radio frequency band to the antenna (ANT) side, based on the control of the processor 1010, or may form a reception path to forward a reception signal of a radio frequency band forwarded from the antenna ANT side, to the transceiver 1020 side, based on the control of the processor 1010.

According to an embodiment, at transmission operation, the transmit/receive switch 1040 may form a transmission path by establishing electrical connection between a connection terminal with the PA 1030 and a connection terminal with the BPF 1050. According to an embodiment, at reception operation, the transmit/receive switch 1040 may form a reception path by establishing electrical connection between the connection terminal with the BPF 1050 and a connection terminal with the transceiver 1020.

According to an embodiment, the transmission path may be a passage for amplifying, by the PA 1030, a transmission signal of a radio frequency band up-converted by the transceiver 1020 and then forwarding to the antenna ANT. According to an embodiment, the reception path may be a passage for forwarding, to the transceiver 1020, a reception signal of a radio frequency band received by the antenna ANT.

According to an embodiment, the BPF 1050 may filter a transmission signal of a radio frequency band presented through the transmit/receive switch 1040 and transmit to the antenna ANT, or may filter a reception signal of a radio frequency band from the antenna ANT and forward to the transceiver 1020 through the transmit/receive switch 1040.

According to an embodiment, the PA 1030, the transmit/receive switch 1040, or the BPF 1050 may be electrically connected to a ground layer 1070.

According to an embodiment, a package 1000 may include components such as the PA 1030, the transmit/receive switch 1040, the BPF 1050, the ground layer 1070, the shield 1060, the shield switch 1080, or the shield pad 1090.

According to an embodiment, the shield 1060 may be formed to surround the component in the package including at least one of the PA 1030, the transmit/receive switch 1040, and the BPF 1050. According to an embodiment, the shield 1060 may block or reduce a noise provided by the component goes out or a noise provided from the outside comes inside.

According to an embodiment, the shield switch 1080 may include one input terminal (a) or two output terminals (b, c). According to an embodiment, the input terminal (a) included in the shield switch 1080 may be electrically connected to the shield 1060. According to an embodiment, the first output terminal (b) included in the shield switch 1080 may be electrically connected to the ground layer 1070, and the second output terminal (c) included in the shield switch 1080 may be electrically connected to the shield pad 1090.

According to an embodiment, the shield pad 1090 may be, for example, electrically connected to at least one component (e.g., the CP 1010) disposed outside the shield 1060.

According to an embodiment, the shield switch 1080 may switch the input terminal (a) to the first output terminal (b) in a first operation state. The first operation state may be, for example, a state in which the shield 1060 is used for noise attenuation in the electronic device. In the first operation state, the shield switch 1080 may electrically connect the input terminal (a) electrically connected to the shield 1060 and the first output terminal (b) electrically connected to the ground layer 1070.

According to an embodiment, the shield switch 1080 may electrically connect the input terminal (a) to the second output terminal (c) in a second operation state. The second operation state may be, for example, a state in which the shield 1060 is used for a purpose other than noise attenuation in the electronic device. In the second operation state, the shield switch 1080 may electrically connect the input terminal (a) electrically connected to the shield 1060 and the second output terminal (c) electrically connected to the shield pad 1090. For example, the shield 1060 may be connected to the shield pad 1090 through the shield switch 1080, to operate as a passage for connecting an external component.

Figure 11:
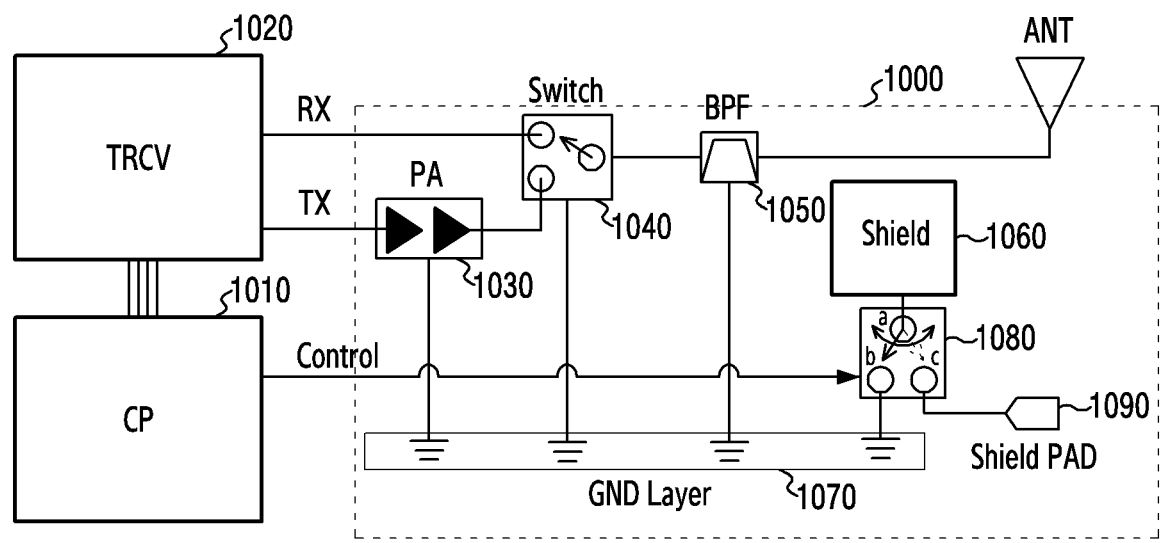
FIG. 11 is a diagram illustrating an example of controlling a shield path in an electronic device according to various embodiments

FIG. 11 is a diagram illustrating an example of controlling a shield path in an electronic device (e.g., the electronic device 101 of FIG. 1) according to various embodiments.

Referring to FIG. 11, the electronic device 101 of an embodiment may include a processor (e.g., including processing circuitry) 1010 (e.g., the processor 120 of FIG. 1), a transceiver (TRCV) 1020, a PA 1030, a transmit/receive switch 1040, a BPF 1050, a shield 430 of FIG. 4 or the shield 830 of FIG. 8), a shield switch 1080 (e.g., the shield switch 440 of FIG. 4 or the shield switch 840 of FIG. 8), a GND layer 1070 (e.g., the ground pad 410 of FIG. 4 or the ground pad 810 of FIG. 8) and/or a shield pad 1090 (e.g., the shield pad 420 of FIG. 4 or the shield pad 820 of FIG. 8).

According to an embodiment, the processor 1010 may include various processing circuitry and control the shield switch 1080 in consideration of an operation mode of the electronic device 101. According to an embodiment, in a first operation state, the processor 1010 may output a control signal of controlling the shield switch 1080, in order to electrically connect an input terminal (a) electrically connected to the shield 1060 and a first output terminal (b) electrically connected to the ground layer 1070. In a second operation state, the processor 1010 may output a control signal of controlling the shield switch 1080, in order to electrically connect the input terminal (a) electrically connected to the shield 1060 and a second output terminal (c) electrically connected to the shield pad 1090.

In an embodiment, the electronic device 101 may include a path electrically connecting the processor 1010 and the shield switch 1080.

Figure 12:
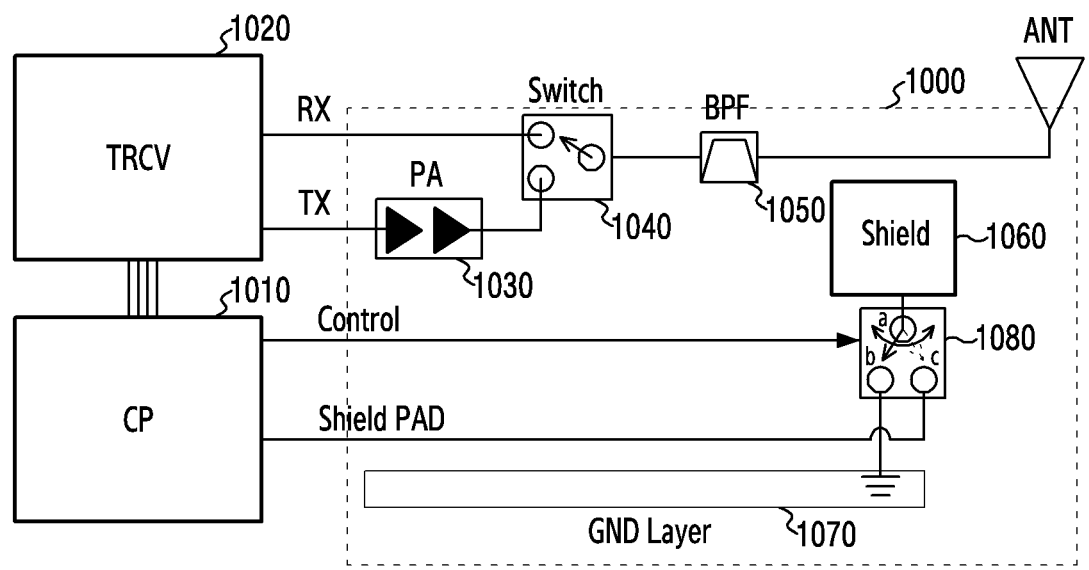
FIG. 12 is a diagram illustrating an example of connection of a shield pad in an electronic device according to various embodiments.

FIG. 12 is a diagram illustrating an example of connection of a shield pad in an electronic device (e.g., the electronic device 101 of FIG. 1) according to various embodiments.

Referring to FIG. 12, the electronic device 101 of an embodiment may include a processor (e.g., including processing circuitry) 1010 (e.g., the processor 120 of FIG. 1), a transceiver (TRCV) 1020, a PA 1030, a transmit/receive switch 1040, a BPF 1050, a shield 1060 (e.g., the shield 430 of FIG. 4 or the shield 830 of FIG. 8), a shield switch 1080 (e.g., the shield switch 440 of FIG. 4 or the shield switch 840 of FIG. 8) and/or a GND layer 1070 (e.g., the ground pad 410 of FIG. 4 or the ground pad 810 of FIG. 8).

According to an embodiment, the shield switch 1080 may include one input terminal (a) and two output terminals (b, c). The input terminal (a) included in the shield switch 1080 may be electrically connected to the shield 1060. The first output terminal (b) included in the shield switch 1080 may be electrically connected to the ground layer 107. The second output terminal (c) included in the shield switch 1080 may be electrically connected to the processor 1010 through a shield pad.

According to an embodiment, when the shield 1060 is in a first operation state used for noise attenuation, the shield switch 1080 may electrically connect the input terminal (a) electrically connected to the shield 1060 and the first output terminal (b) electrically connected to the ground layer 1070.

According to an embodiment, when the shield 1060 is in a second operation state used for a purpose other than noise attenuation, the shield switch 1080 may electrically connect the input terminal (a) electrically connected to the shield 1060 and the second output terminal (c) electrically connected to the processor 1010 through the shield pad. In an embodiment, when the input terminal (a) electrically connected to the shield 1060 is electrically connected to the second output terminal (c) electrically connected to the processor 1010 through the shield pad, the processor 1010 may check whether a short circuit has happened between the shield 1060 and another construction.

Figure 13:
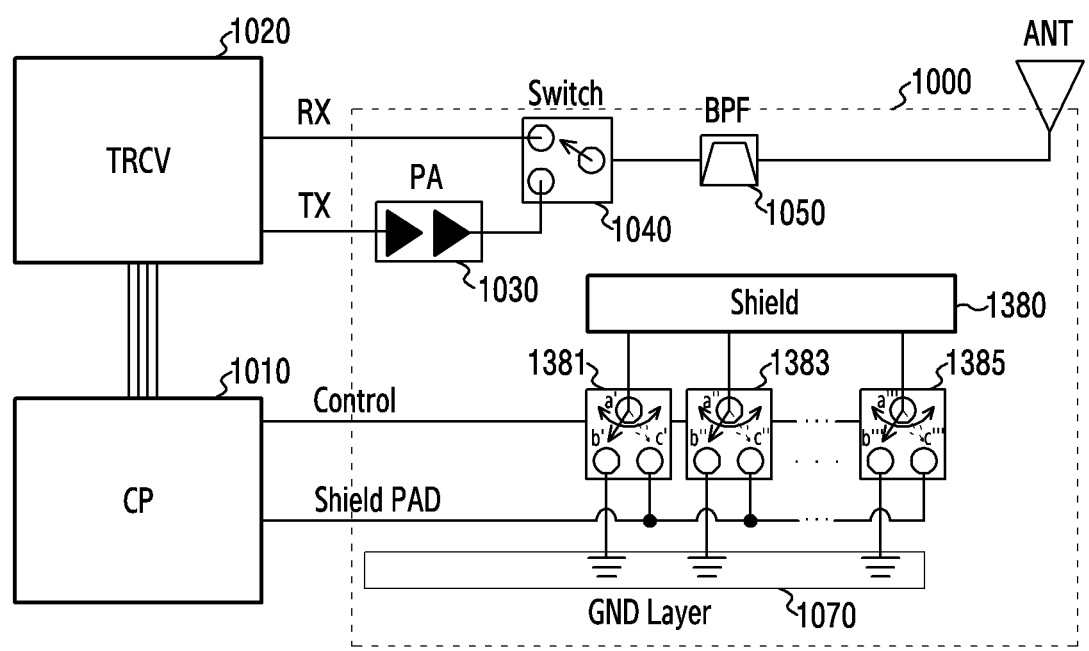
FIG. 13 is a diagram illustrating an example of controlling a shield path in an electronic device according to various embodiments.

FIG. 13 is a diagram illustrating an example of controlling a shield path in an electronic device (e.g., the electronic device 101 of FIG. 1) according to various embodiments.

Referring to FIG. 13, the electronic device 101 of an embodiment may include a processor 1010 (e.g., the processor 120 of FIG. 1), a transceiver (TRCV) 1020, a PA 1030, a transmit/receive switch 1040, a BPF 1050, a shield 1380 (e.g., the shield 630 of FIG. 6), a plurality of shield switches 1381, 1383, and 1385 (e.g., the shield switches 641 and 643 of FIG. 6) and/or a ground layer (GND layer) 1070 (e.g., the ground pad 610 of FIG. 6).

According to an embodiment, the plurality of shield switches 1381, 1383, and 1385 may include one input terminal a', a", and a'", first output terminals b', b", and b'" and second output terminals c', c", and c'". The input terminals a', a", and a'" included in the shield switches 1381, 1383, and 1385 may be electrically connected to the shield 1380. The first output terminals b', b", and b'" included in the shield switches 1381, 1383, and 1385 may be electrically connected to the ground layer 1070. The second output terminals c', c", and c'" included in the shield switches 1381, 1383, and 1385 may be electrically connected to the processor 1010 through a shield pad.

According to an embodiment, the processor 1010 may control the shield switches 1381, 1383, and 1385 or each of the shield switches 1381, 1383, and 1385 in consideration of an operation mode of the electronic device 101. The processor 1010 may output a control signal of controlling all or some of the shield switches 1381, 1383, and 1385, in order to electrically connect the input terminals a', a", and a'" electrically connected to the shield 1380 and the first output terminals b', b", b'" electrically connected to the ground layer 1070, in a first operation state in which the shield 1380 is used for noise attenuation. The processor 1010 may output a control signal of controlling all or some of the shield switches 1381, 1383, and 1385, in order to electrically connect the input terminals a', a", and a'" electrically connected to the shield 1380 and the second output terminals c', c", and c'" electrically connected to the processor 1010 through a shield pad, in a second operation state in which the shield 1080 is used for a purpose other than noise attenuation. The processor 1010 may control to differently connect the terminals of the shield switches 1381, 1383, and 1385.

Figure 14:
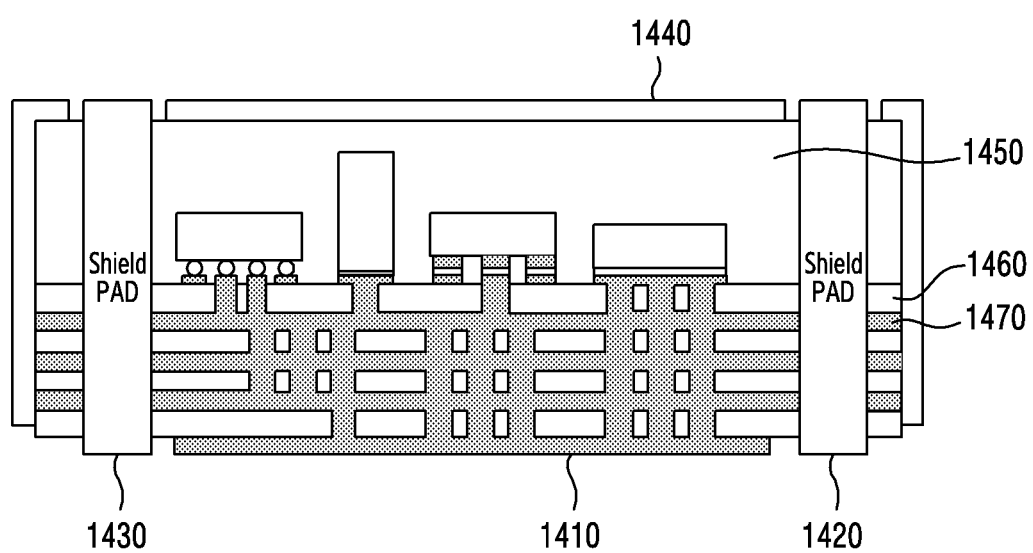
FIG. 14 is a cross-sectional view of a package structure in an electronic device according to various embodiments.

FIG. 14 is a cross-sectional view of a package structure in an electronic device (e.g., the electronic device 101 of FIG. 1) according to various embodiments.

Referring to FIG. 14, one package of an embodiment may include a ground pad 1410, a plurality of shield pads 1420 and 1430, a laminated structure, a plurality of components (or devices) disposed on one surface of the laminated structure, a shield 1440 and/or a mold 1450.

According to an embodiment, the laminated structure may be a structure in which a plurality of ground layers (represented by dots in the drawing) and insulating layers 1460 made of an insulator between the ground layers are laminated.

According to an embodiment, the ground layers may be electrically connected to the ground pad 1410 through a via. For example, the plurality of components (e.g., a switch, an LC, a BPF, or a PA) may be electrically connected to the ground layers through a via.

In an embodiment, the plurality of components may be electrically connected to the ground pad 1410 through a via. According to an embodiment, the ground pad 1410 and/or the plurality of shield pads 1420 and 1430 may be arranged to be soldered to a PCB (e.g., the PCB 210 of FIG. 2 or the PCB 310 of FIG. 3).

According to an embodiment, the shield 1440 may be formed to be electrically connected to at least one of the plurality of ground layers while covering wherein the components (or devices) disposed on one surface of the laminated structure are not exposed to the outside.

According to an embodiment, the plurality of shield pads 1420 and 1430 may be configured to be electrically connected to at least one of the plurality of ground layers, by penetrating the plurality of ground layers in a vertical direction and filling a conductive material.

According to an embodiment, the plurality of shield pads 1420 and 1430 may penetrate the shield 1440, or may be covered by the shield 1440. According to an embodiment, the plurality of shield pads 1420 and 1430 may not be directly connected to the shield 1440. In this case, the plurality of shield pads 1420 and 1430 may be electrically connected to the plurality of ground layers vertically penetrated.

According to an embodiment, the first shield pad 1420 may be formed adjacent to one side of the package so as to vertically penetrate the plurality of ground layers included in the package, and the second shield pad 1430 may be formed adjacent to the other side of the package so as to vertically penetrate the plurality of ground layers included in the package. According to an embodiment, the first shield pad 1420 and the second shield pad 1430 may be made of a conductive material and thus be electrically connected to one or a plurality of ground layers included in the plurality of ground layers.

Figure 15:
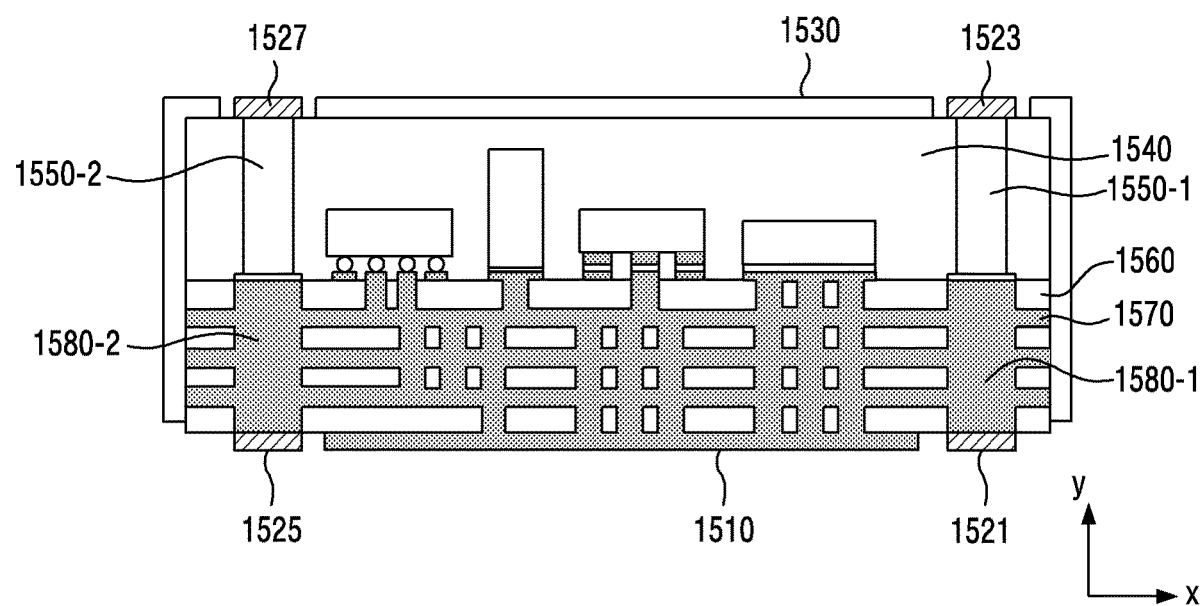
FIG. 15 is a cross-sectional view of a package structure in an electronic device according to various embodiments.

FIG. 15 is a cross-sectional view of a package structure in an electronic device (e.g., the electronic device 101 of FIG. 1) according to various embodiments.

Referring to FIG. 15, a package of an embodiment may include a ground pad 1510, one or a plurality of lower shield pads 1521 and 1525, one or a plurality of upper shield pads 1523 and 1527, one or a plurality of vertical via holes 1580-1 and 1580-2, one or a plurality of pillars 1550-1 and 1550-2, a laminated structure in which a plurality of layers are laminated, and a plurality of components (or devices) disposed on one surface of the laminated structure, a shield 1530 and/or a mold 1540. The laminated structure may be a structure in which a plurality of ground layers 1570 (represented by dots in the drawing) and insulating layers 1560 made of an insulator between the ground layers 1570 are laminated. The ground layers 1570 may be electrically connected to the ground pad 1510 through a via. The plurality of components (e.g., a switch, an LC, a BPF, or a PA) may be electrically connected to the ground layers 1570 through a via. Accordingly, the plurality of components may be electrically connected to the ground pad 1510 through a via. The ground pad 1510 may be disposed to be soldered to a PCB (e.g., the PCB 210 of FIG. 2 or the PCB 310 of FIG. 3).

According to an embodiment, the shield 1530 may be formed to be electrically connected to at least one of the plurality of ground layers 1570 while covering wherein the components (or devices) disposed on one surface of the laminated structure are not exposed to the outside.

According to an embodiment, the one or plurality of lower shield pads 1521 and 1525 may be disposed to be electrically connected to one of the one or plurality of vertical via holes 1580-1 and 1580-2 on the other surface of the laminated structure. The one or plurality of lower shield pads 1521 and 1525 may be, for example, electrically connected to a lower surface, which is one side of one vertical via hole 1580-1 or 1580-2 among the one or plurality of vertical via holes 1580-1 and 1580-2. The one or plurality of lower shield pads 1521 and 1525 may be disposed to be soldered to a PCB (e.g., the PCB 210 of FIG. 2 or the PCB 310 of FIG. 3).

According to an embodiment, the one or plurality of upper shield pads 1523 and 1527 may be disposed to form the first pillar 1550-1 or the second pillar 1550-2 in at least a part of the shield 1530, and space the first pillar 1550-1 or the second pillar 1550-2 apart from the shield 1530. The one or plurality of upper shield pads 1523 and 1527 may be, for example, disposed to be in parallel to the shield 1530. The one or plurality of upper shield pads 1523 and 1527 may be connected to be electrically connected to, or be connected to be electrically insulated from, the shield 1530.

According to an embodiment, the one or plurality of upper shield pads 1523 and 1527 may be disposed to face the one or plurality of lower shield pads 1521 and 1525 in a vertical direction (−y direction). For example, the first upper shield pad 1523 may be disposed to face the first lower shield pad 1521 in the vertical direction, and the second upper shield pad 1527 may be disposed to face the second lower shield pad 1525 in the vertical direction.

According to an embodiment, the pillars 1550-1 and 1550-2 and the vertical via holes 1580-1 and 1580-2 may be disposed between the upper shield pads 1523 and 1527 and the lower shield pads 1521 and 1525 that are disposed to face each other. The vertical via holes 1580-1 and 1580-2 may be configured to be electrically connected to at least one of the plurality of ground layers 1570, by penetrating the plurality of ground layers 1570 in a vertical direction from the lower shield pads 1521 and 1525 and filling a conductive material.

The pillars 1550-1 and 1550-2 may be configured to connect between the vertical via holes 1580-1 and 1580-2 exposed on uppermost surfaces of the plurality of ground layers 1570, and the upper shield pads 1523 and 1527. For example, the first upper shield pad 1523 may be connected to the first lower shield pad 1521 by means of the pillar 1550-1 and the vertical via hole 1580-1 penetrating the package in the vertical direction. Also, for example, the second upper shield pad 1527 may be connected to the second lower shield pad 1525 by means of the pillar 1550-2 and the vertical via hole 1580-2 penetrating the package in the vertical direction.

According to an embodiment, a first structure penetrating vertically the plurality of ground layers 1570 included in the package may be formed adjacent to one side of the package, and a second structure penetrating vertically the plurality of ground layers 1570 included in the package may be formed adjacent to the other side of the package. In an example, the first and second structures may be structures connecting the upper shield pads 1523 and 1527 and the lower shield pads 1521 and 1525 by means of the pillars 1550-1 and 1550-2 and the vertical via holes 1580-1 and 1580-2 penetrating the package in the vertical direction.

Figure 16:
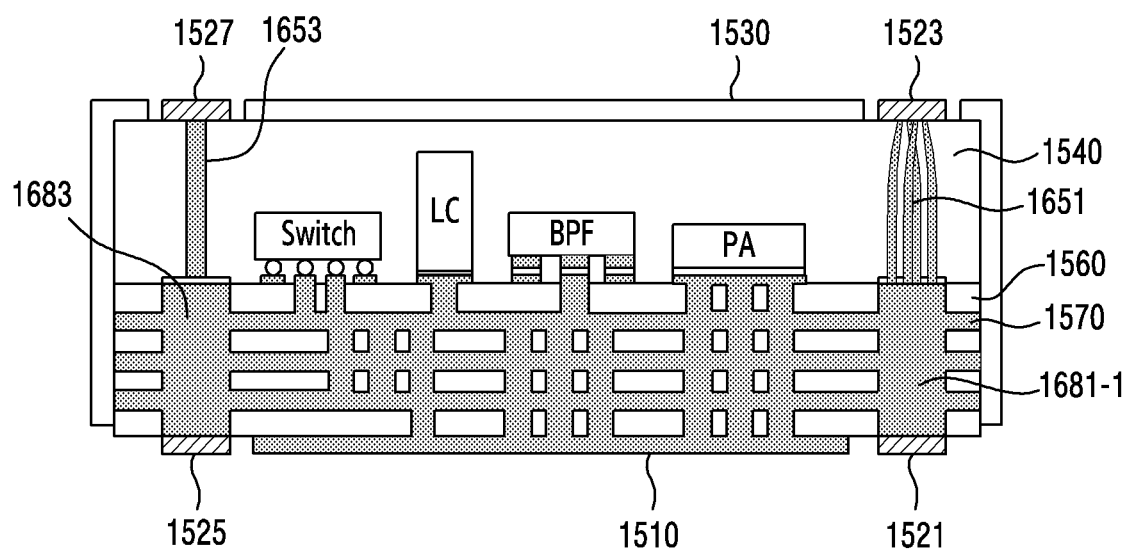
FIG. 16 is a cross-sectional view of a package structure in an electronic device according to various embodiments.

FIG. 16 is a cross-sectional view of a package structure in an electronic device (e.g., the electronic device 101 of FIG. 1) according to various embodiments.

Referring to FIG. 16, a package of an embodiment may include a ground pad 1510, one or a plurality of lower shield pads 1521 and 1525, one or a plurality of upper shield pads 1523 and 1527, one or a plurality of vertical via holes 1681-1 and 1683, one or a plurality of wire bonds 1651 and 1653, a laminated structure, a plurality of components (or devices) disposed on one surface of the laminated structure, a shield 1530 and/or a mold 1540.

The laminated structure may be a structure in which a plurality of ground layers 1570 (represented by dots in the drawing) and insulating layers 1560 made of an insulator between the ground layers 1570 are laminated. The ground layers 1570 may be electrically connected to the ground pad 1510 through a via. The plurality of components (e.g., a switch, an LC, a BPF, or a PA) may be electrically connected to the ground layers 1570 through a via. Accordingly, the plurality of components may be electrically connected to the ground pad 1510 through a via. The ground pad 1510 may be disposed to be soldered to a PCB (e.g., the PCB 210 of FIG. 2 or the PCB 310 of FIG. 3).

According to an embodiment, the shield 1530 may be formed to be electrically connected to at least one of the plurality of ground layers while covering wherein components (or devices) disposed on one surface of the laminated structure are not exposed to the outside.

According to an embodiment, the one or plurality of lower shield pads 1521 and 1525 may be disposed to be electrically connected to one of the one or plurality of vertical via holes 1681-1 and 1683 on a lowermost surface on which the plurality of ground layers 1570 are laminated. The one or plurality of lower shield pads 1521 and 1525 may be, for example, connected to be electrically connected to a lower surface that is one side of one of the one or plurality of vertical via holes 1681-1 and 1683. The one or plurality of lower shield pads 1521 and 1525 may be disposed to be soldered to a PCB (e.g., the PCB 210 of FIG. 2 or the PCB 310 of FIG. 3).

According to an embodiment, the one or plurality of upper shield pads 1523 and 1527 may be disposed to form the first wire bond 1651 or the second wire bond 1653 in at least a part of the shield 1530, and space the first wire bond 1651 and the second wire bond 1653 apart from the shield 1530. The one or plurality of upper shield pads 1523 and 1527 may be, for example, disposed to be in parallel to the shield 1530. The one or plurality of upper shield pads 1523 and 1527 may be connected to be electrically connected to, or electrically insulated from, the shield 1530.

According to an embodiment, the one or plurality of upper shield pads 1523 and 1527 may be disposed to face the one or plurality of lower shield pads 1521 and 1525 in a vertical direction. For example, the first upper shield pad 1523 may be disposed to face the first lower shield pad 1521 in the vertical direction, and the second upper shield pad 1527 may be disposed to face the second lower shield pad 1525 in the vertical direction.

According to an embodiment, the wire bonds 1651 and 1653 and the vertical via holes 1681-1 and 1683 may be disposed between the upper shield pads 1523 and 1527 and the lower shield pads 1521 and 1525 arranged to face each other. The vertical via holes 1681-1 and 1683 may be configured to be electrically connected to at least one of the plurality of ground layers 1570, by penetrating the plurality of ground layers 1570 in the vertical direction from the lower shield pads 1521 and 1525 and filling a conductive material.

The wire bonds 1651 and 1653 may be configured to connect between the vertical via holes 1681-1 and 1683 and the upper shield pads 1523 and 1527 exposed on one surface of the laminated structure. Accordingly, the upper shield pads 1523 and 1527 may be connected to the lower shield pads 1521 and 1525 by means of the wire bonds 1651 and 1653 and the vertical via holes 1681-1 and 1683 penetrating the package in the vertical direction.

According to an embodiment, the first wire bond 1651 and the second wire bond 1653 may be different in thickness. In an embodiment, only the second wire bond 1653 may be used instead of the first wire bond 1651, or only the first wire bond 1651 may be used instead of the second wire bond 1653, or the positions of the first wire bond 1651 and the second wire bond 1653 may be changed.

According to an embodiment, a first structure penetrating vertically the plurality of ground layers included in the package may be formed adjacent to one side of the package, and a second structure vertically penetrating the plurality of ground layers included in the package may be formed adjacent to the other side of the package. The first and second structures may be structures connecting the upper shield pads 1523 and 1527 and the lower shield pads 1521 and 1525 by means of the wire bonds 1651 and 1653 and the vertical via holes 1681-1 and 1683 penetrating the package in the vertical direction.

Figure 17:
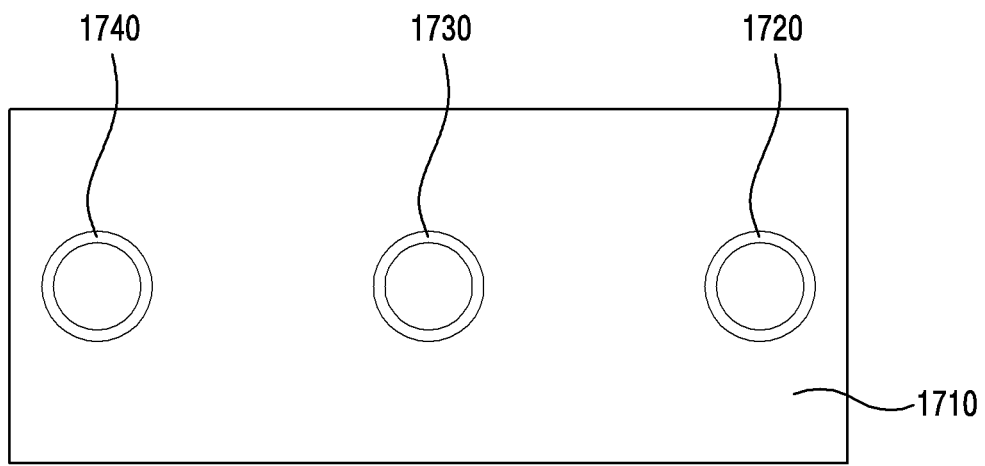
FIG. 17 is a diagram illustrating an example in which upper shield pads are inserted into a shield instead of a shield switch in an electronic device according to various embodiments.

FIG. 17 is a diagram illustrating an example in which a shield pad or upper shield pads are inserted into a shield instead of a shield switch in an electronic device (e.g., the electronic device 101 of FIG. 1) according to various embodiments.

Referring to FIG. 17, a package included in the electronic device 101 of an embodiment may have a structure in which three upper shield pads 1720, 1730, and 1740 are inserted through a shield upper surface 1710. A portion of the shield upper surface 1710 of the package may be used exclusively for the three upper shield pads 1720, 1730, and 1740. In this case, the package included in the electronic device 101 may have a simple structure or construction without using the shield switch.

Although not shown, in consideration of the structure shown in FIG. 15 and/or FIG. 16, each of the three upper shield pads 1720, 1730, and 1740 may be connected to one side surface (e.g., an upper surface) of a pillar (e.g., the pillar 1550-1 and 1550-2 of FIG. 15) or a wire bond (e.g., the wire bond 1651 and 1653 of FIG. 16). Although it is illustrated in the drawing that the electronic device 101 includes the three upper shield pads, this is only an example, and fewer or more than the three shield pads may be included in the electronic device 101.

According to an embodiment, the three upper shield pads 1720, 1730, and 1740 may be disposed to form a first pillar 1720, a second pillar 1730, or a third pillar 1740 on at least a part of the upper surface 1710 of the shield, and space the first pillar 1720, the second pillar 1730, or the third pillar 174 apart from the shield. The three shield pads 1720, 1730, and 1740 may be, for example, disposed to be substantially horizontal with the upper surface 1710 of the shield.

Figure 18:
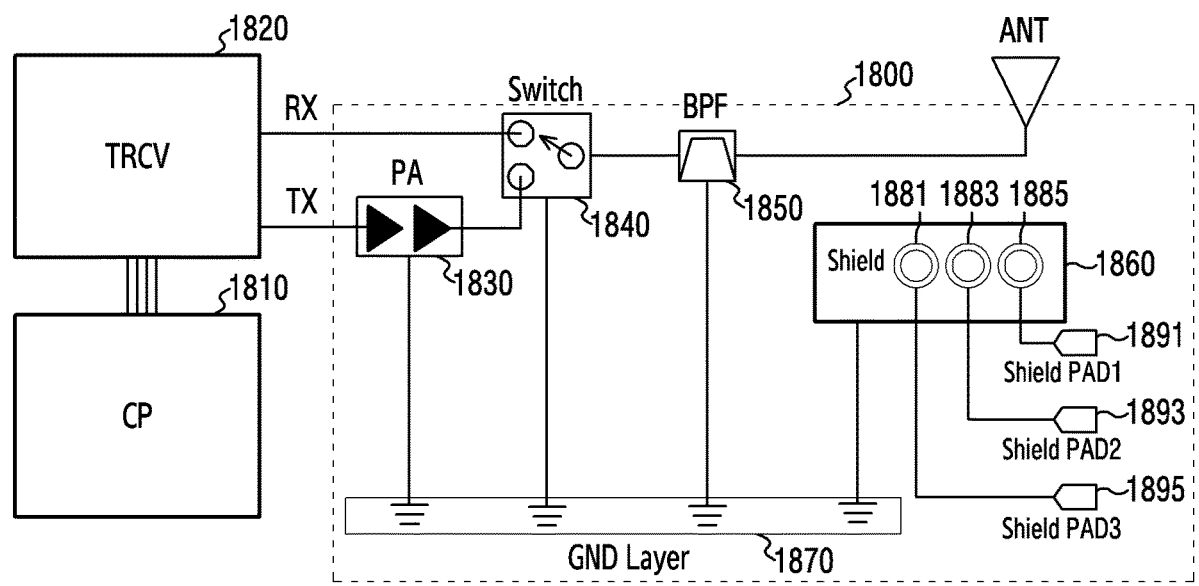
FIG. 18 is a diagram illustrating an example of controlling a shield path when upper shield pads are inserted into a shield instead of a shield switch in an electronic device according to various embodiments.

FIG. 18 is a diagram illustrating an example of controlling a shield path, when upper shield pads are inserted into a shield instead of a shield switch in an electronic device (e.g., the electronic device 101 of FIG. 1) according to various embodiments.

Referring to FIG. 18, the electronic device 101 of an embodiment may include a processor (e.g., including processing circuitry) 1810 (e.g., the processor 120 of FIG. 1), a transceiver (TRCV) 1820, a PA 1830, a transmit/receive switch 1840, a BPF 1850, a shield 1860, a plurality of upper shield pads 1881, 1883, and 1885 (e.g., the upper shield pads 1523 and 1527 of FIG. 15 or the upper shield pads 1523 and 1527 of FIG. 16 or the upper shield pads 1720, 1730, and 1740 of FIG. 17), a GND layer 1870 (e.g., the ground pad 1510 of FIG. 15 or the ground pad 1510 of FIG. 16) and/or a plurality of lower shield pads 1891, 1893, and 1895 (e.g., the lower shield pads 1521 and 1525 of FIG. 15 or the lower shield pads 1521 and 1525 of FIG. 16).

According to an embodiment, the package 1800 may include components such as the PA 1830, the transmit/receive switch 1840, the BPF 1850, the ground layer 1870, a shield 1860, the upper shield pads 1881, 1883, and 1885 or the shield pads 1891, 1893, and 1895.

According to an embodiment, the plurality of upper shield pads 1881, 1883, and 1885 may be connected to be electrically connected to the plurality of lower shield pads 1891, 1893, and 1895 in a one-to-one correspondence. According to an embodiment, the plurality of upper shield pads 1881, 1883, and 1885 may be, for example, connected to the plurality of lower shield pads 1891, 1893, and 1895 through one of the pillars 1550-1 and 1550-2 or the wire bonds 1651 and 1653 and the vertical via holes 1580-1 and 1580-2 and 1681-1 and 1683.

According to an embodiment, the plurality of shield pads 1891, 1893, and 1895 may be configured to be electrically connected to at least one of a plurality of ground layers, by penetrating the plurality of ground layers in a vertical direction and filling a conductive material.

Figure 19:
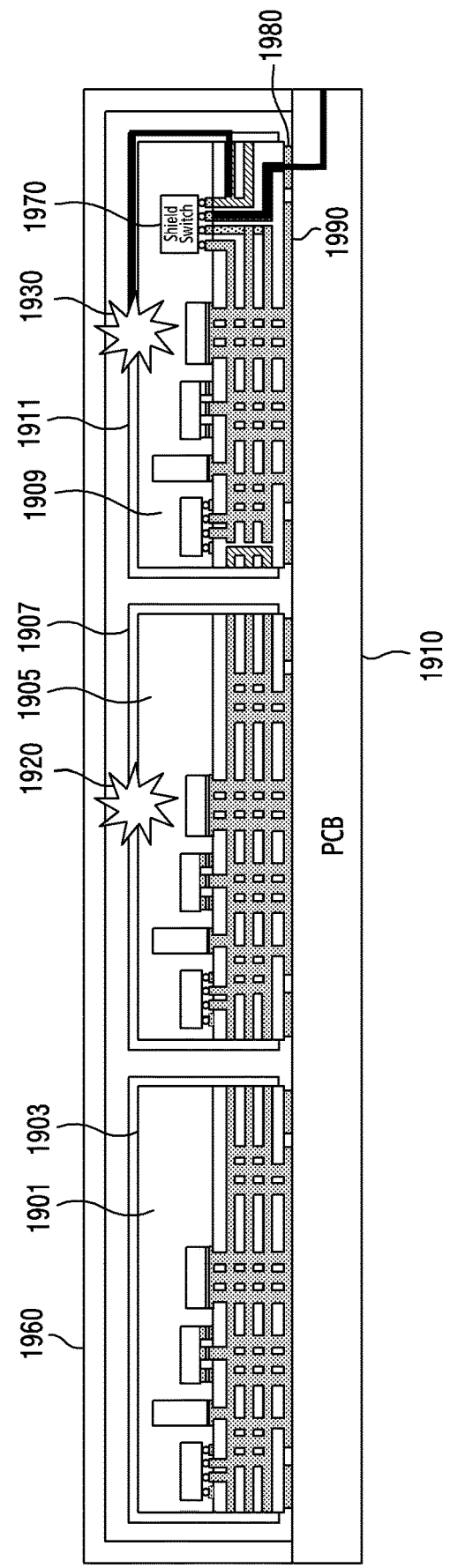
FIGS. 19, 20 and 21 are diagrams illustrating examples in which a noise is provided in a shield structure applied to an electronic device according to various embodiments.
Figure 20:
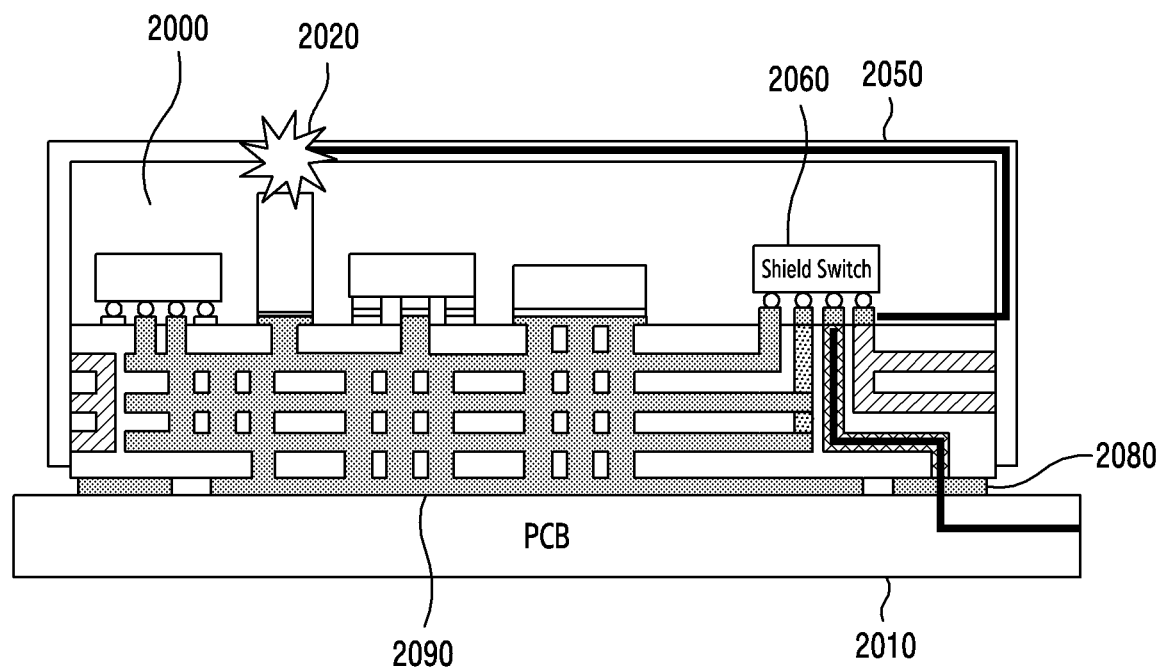
Figure 21:
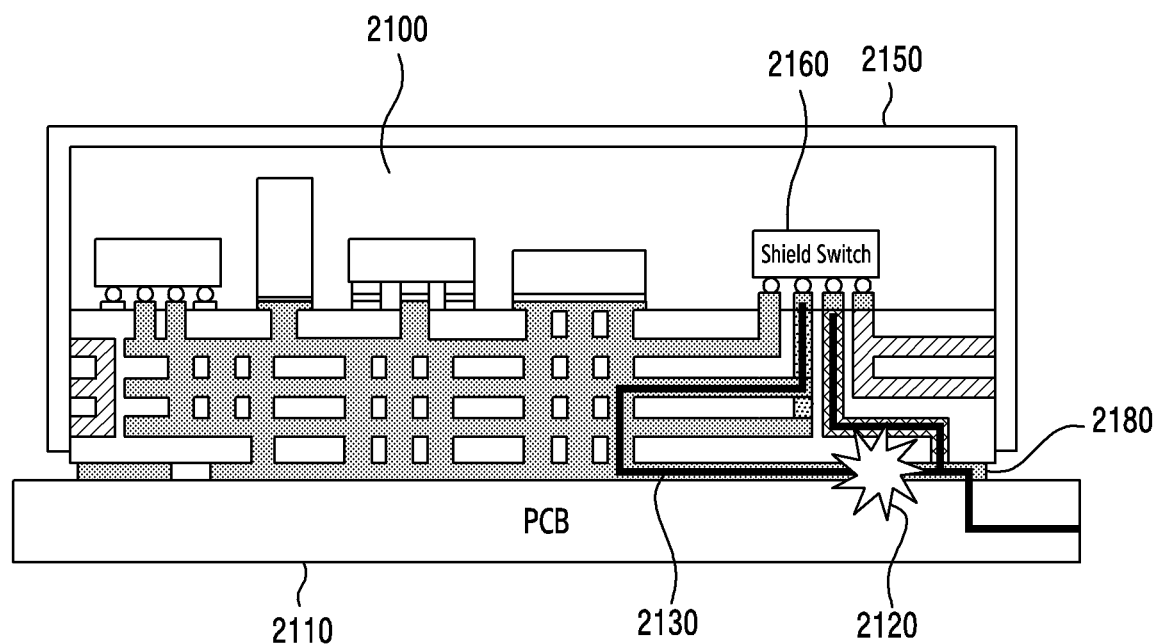

FIGS. 19, 20 and FIG. 21 are diagrams illustrating examples in which a noise is provided in a shield structure applied to an electronic device (e.g., the electronic device 101 of FIG. 1) according to various embodiments. The electronic device 101 of FIG. 19 may include packages 1901, 1905, and 1909, and shields 1903, 1907, and 1911 included in the packages 1901, 1905, and 1909. The electronic device disclosed in FIG. 19 may include the electronic device 101 disclosed in FIG. 2 and the electronic device 101 disclosed in FIG. 3.

Referring to FIG. 19, when a shield can and/or tool 1960 covering a PCB 1910 in the electronic device 101 is made of a metal material, the shield can and/or tool 1960 may be bent, not a straight line. In this case, the shield can and/or tool 1960 may come into contact with internal components due to an external shock or a manufacturing process, and thus burning damages 1920 and 1930 may occur. It may be confirmed that, when the shield 1911 is connected to a shield pad 1980 by a shield switch 1970, the contact causing the burning damages 1920 and 1930 happens by touching a metal material such as the shield can and/or tool 1960 to the shield 1911. It may be confirmed that, when the shield 1911 is connected to a ground pad 1990 by the shield switch 1970, a short circuit happens in the shield 1911.

Referring to FIG. 20, a situation may occur in which, among components disposed within a shield 2050 of a package 2000 disposed on a PCB 2010, a component having a great height is short-circuited 2020 to the shield 2050 due to a manufacturing process (laser marking fail) or an external factor (mold migration) in the electronic device 101.

According to an embodiment, when the shield 2050 is electrically connected to the shield pad 2080 by a shield switch 2060, the short circuit 2020 may happen by touching a component to the shield 2050. When the shield 2050 is connected to a ground pad 2090 by the shield switch 2060, a short circuit may happen in the shield 2050.

Referring to FIG. 21, when a PCB package 2100 is soldered to a surface of a PCB 2110 using a surface mount technology (SMT) in a process of manufacturing the electronic device 101, a short circuit 2120 may happen when impurities are introduced between a ground pad 2130 and a shield pad 2180. As such, when the impurities are inserted between a port not having a detection process and the ground, the inserted impurities may be easily detected by the shield pad 2180 appropriately disposed.

When the short circuit described with reference to FIGS. 19, 20 and 21 happens, repair may be made or defect processing may be performed, after a mechanical interference position is confirmed. However, when the short circuit does not happen, the original state may be restored by connecting the shield switch to the ground pad.

Figure 22:
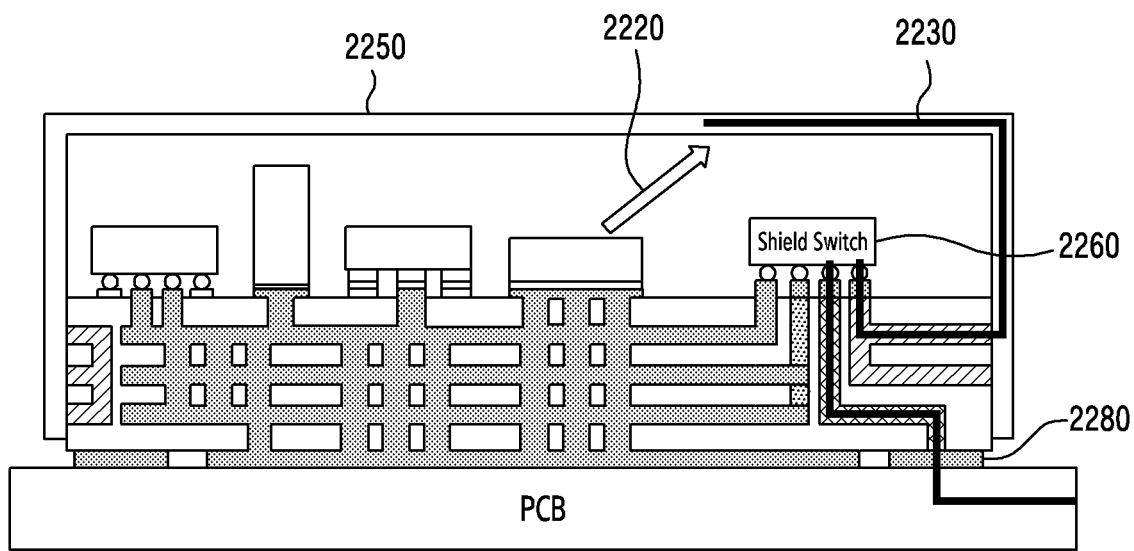
FIG. 22 is a diagram illustrating an example of measuring a shield effect in an electronic device according to various embodiments.

FIG. 22 is a diagram illustrating an example of measuring a shield effect in an electronic device (e.g., the electronic device 101 of FIG. 1) according to various embodiments.

Referring to FIG. 22, the electronic device 101 may measure a shield effect in a 3D form at all points using a near field probe device. In this case, a lot of time and money may be required for measurement and also, it may be difficult to measure all components. To address this problem, when a radio frequency signal 2220 reaches a shield 2250 made of a metal material, the shield effect may be measured using a skin effect providing a current 2230. For this, a shield switch 2260 may electrically connect the shield 2250 to a shield pad 2280. By electrically connecting the shield pad 2280 to a measuring device (not shown), the shield effect may be simply measured and also, all components may be measured in a short time and without additional cost.

Figure 23:
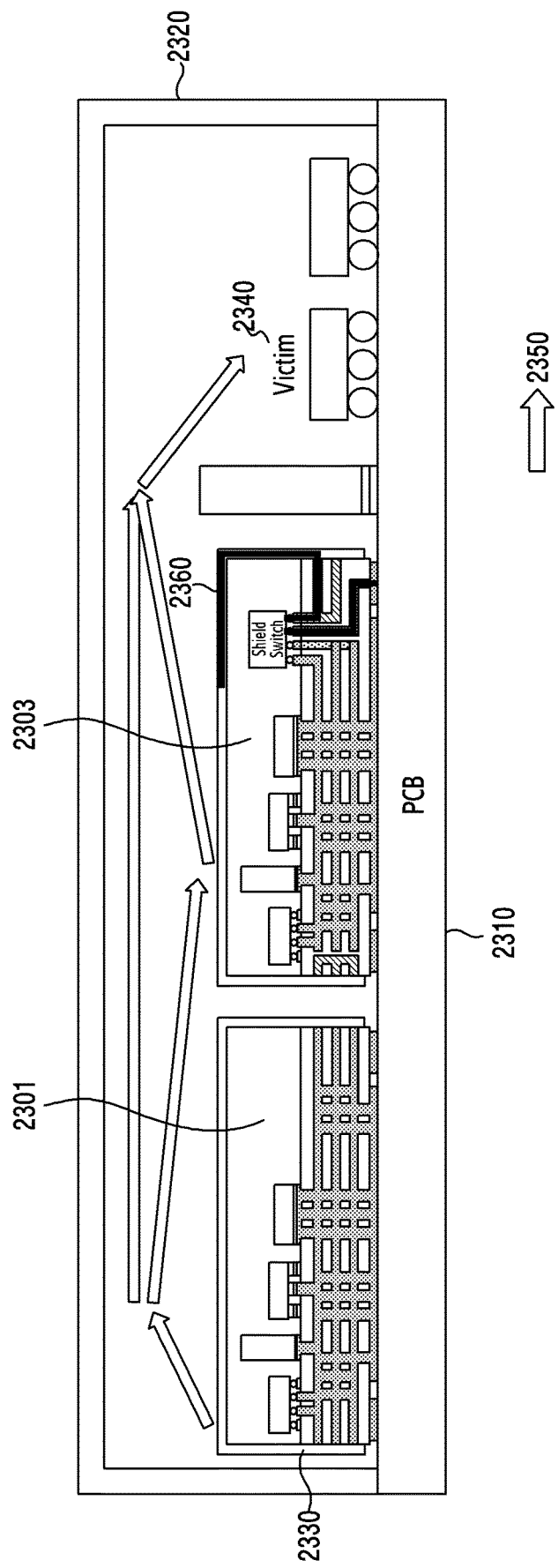
FIG. 23 is a diagram illustrating an example in which a noise is provided in an electronic device according to various embodiments.

FIG. 23 is a diagram illustrating an example in which a noise is provided in an electronic device (e.g., the electronic device 101 of FIG. 1) according to various embodiments.

Referring to FIG. 23, the electronic device 101 may have a structure in which a plurality of packages are covered with a shield can 2320 installed on one surface of a PCB 2310. In each of the plurality of packages, internal components may be covered with shields 2330 and 2360. According to this structure, an aggressor component and a victim component may exist. In this case, a noise provided from the aggressor component may affect an adjacent victim component, or a space between a shield component and the shield can 2320 may be formed like a waveguide having air between metals, to propagate a noise even to a distant victim component 2340 (reference number 2350). The noise forwarded to the victim component may be, for example, decreased, by isolating, from the ground, the shields 2330 and 2360 of packages 2301 and 2303 between the aggressor component and the victim component and hindering the formation of the waveguide. Using this principle, it is possible to distinguish which component is the aggressor component and which is the victim component in the electronic device 101.

Figure 24:
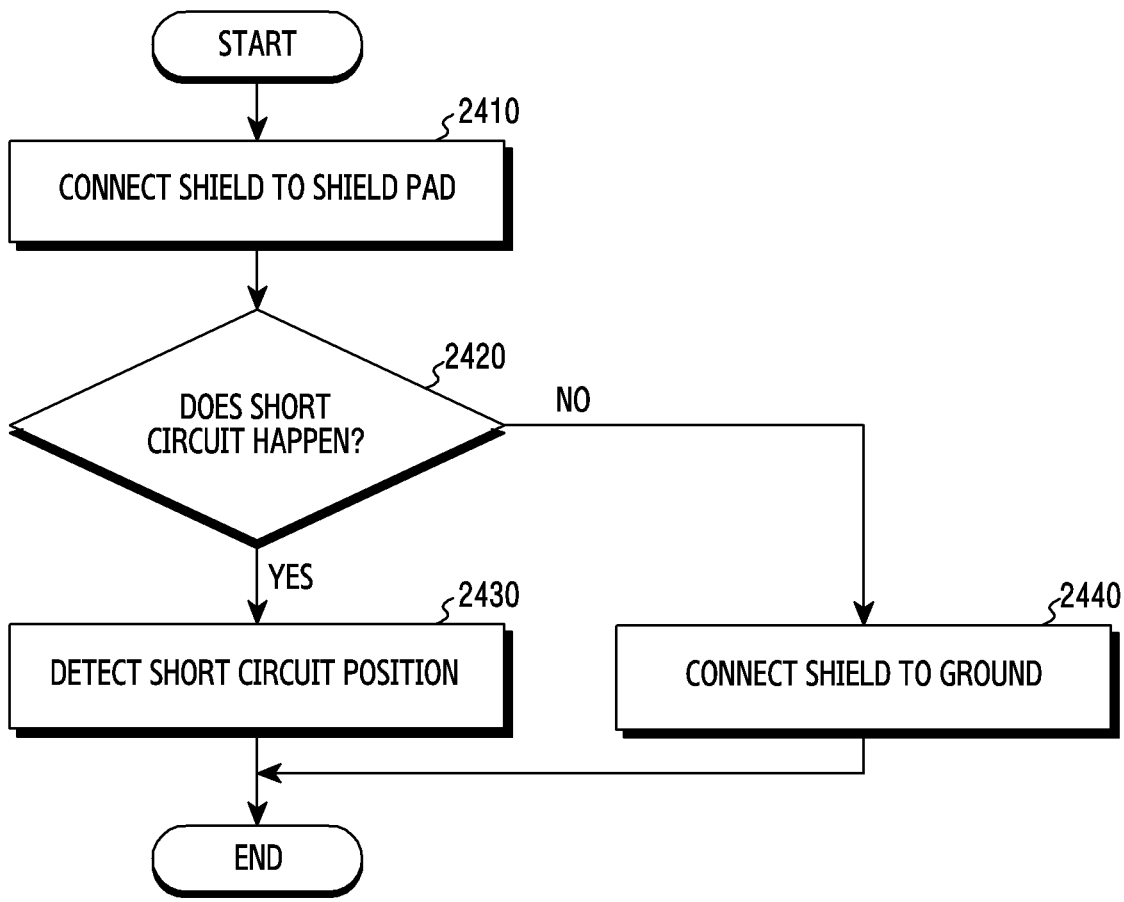
FIG. 24 is a flowchart illustrating an example operation of controlling a shield path in an electronic device according to various embodiments.

FIG. 24 is a flowchart illustrating an example operation of controlling a shield path in an electronic device (e.g., the electronic device 101 of FIG. 1) according to various embodiments.

Referring to FIG. 24, in operation 2410, the electronic device 101 may electrically connect a shield (e.g., the shield 1960 of FIG. 19, the shield 2050 of FIG. 20, or the shield 2150 of FIG. 21) to a shield pad (e.g., the shield pad 1980 of FIG. 19, the shield pad 2080 of FIG. 20, or the shield pad 2180 of FIG. 21). The electronic device 101 may, for example, control a shield switch (e.g., the shield switch 1970 of FIG. 19, the shield switch 2060 of FIG. 20, or the shield switch 2160 of FIG. 21) to connect the shield to the shield pad.

In operation 2420, the electronic device 101 may monitor whether one or a plurality of short circuits (e.g., the first and second short circuits 1920 and 1930 of FIG. 19, the short circuit 2020 of FIG. 20 or the short circuit 2120 of FIG. 21) happen in a package including the shield. The electronic device 101 may, for example, detect the short circuit happening in the package.

According to an embodiment, when it is determined that the short circuit has happened in operation 2420, in operation 2430, the electronic device 101 may detect a position where the short circuit has happened. The short circuit may, for example, happen at the shield or happen at a ground pad. When detecting a position where the short circuit has happened, the electronic device 101 may control a display and/or a speaker, etc. to display the happening of the short circuit and a position of the happening of the short circuit to a user, or guide it by a voice.

According to an embodiment, after a user confirms a notification of the electronic device 101, the user may repair the short circuit so as to address a cause of the short circuit, or may process it as a defect. For example, when the short circuit happens, the user may confirm a mechanical interference position and then repair it or process it as a defect.

According to an embodiment, when it is determined that the short circuit has not happened in operation 2420, in operation 2440, the electronic device 101 may connect the shield to the ground and restore the original state. The electronic device 101 may, for example, control the shield switch to electrically connect the shield to a ground layer.

Figure 25:
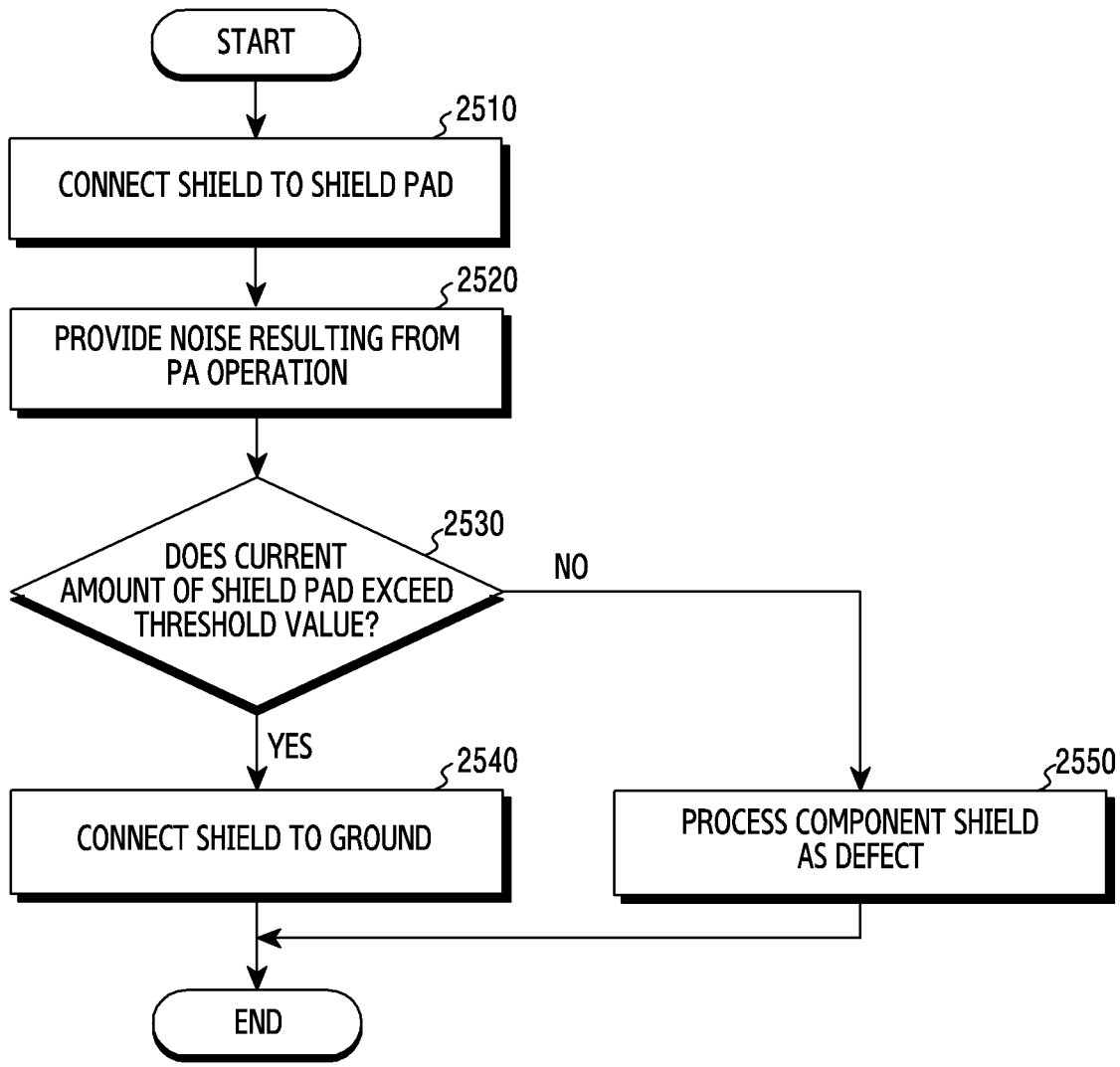
FIG. 25 is a flowchart illustrating an example operation of controlling a shield path in an electronic device according to various embodiments.

FIG. 25 is a flowchart illustrating an example operation of controlling a shield path in an electronic device (e.g., the electronic device 101 of FIG. 1) according to various embodiments.

Referring to FIG. 25, in operation 2510, the electronic device 101 may electrically connect a shield (e.g., the shield 1960 of FIG. 19, the shield 2050 of FIG. 20, or the shield 2150 of FIG. 21) to a shield pad (e.g., the shield pad 1980 of FIG. 19, the shield pad 2080 of FIG. 20, or the shield pad 2180 of FIG. 21). The electronic device 101 may, for example, control a shield switch (e.g., the shield switch 1970 of FIG. 19, the shield switch 2060 of FIG. 20, or the shield switch 2160 of FIG. 21) to electrically connect the shield with the shield pad.

In operation 2520, the electronic device 101 may provide a noise provided therein. The noise may be, for example, provided due to a signal radiated by a PA operation. The provision of the noise may be, for example, detected by measuring a shield effect of the component as shown in FIG. 22.

In operation 2530, the electronic device 101 may measure the shield effect, based on whether an amount of current to the shield pad exceeds a threshold value. For example, when the current amount provided in the shield pad is less than or equal to the threshold value, the electronic device 101 may determine that the shield effect is not good and thus the radiation of a radio frequency signal to the outside happens. However, when the current amount provided in the shield pad exceeds the threshold value, the electronic device 101 may determine that the shield effect of the shield is good.

In an example, the shield effect may be measured in consideration of a skin effect providing an electric current, when a radio frequency signal reaches a metal material.

According to an embodiment, the skin effect may refer, for example, to a phenomenon in which a current amount more flows in a peripheral portion of a high current density than in a central portion of a low current density, because a magnetic flux linkage is relatively larger in the central portion than in the peripheral portion in a conducting wire. The skin effect is increased as an effective resistance is increased or a frequency is increased. When the amount of current to the shield pad considering the skin effect is measured, it may be possible to measure a shield effect for all components at a short time and without an additional cost.

According to an embodiment, when the amount of current to the shield pad does not exceed the threshold value in operation 2530, the electronic device 101 may, in operation 2550, detect that the shield effect for the component is not normal. When detecting that the shield effect is not normal, the electronic device 101 may control a display and/or a speaker, etc. to display that a component shield is defective to the user or guide it by a voice. After confirming a notification of the electronic device 101, the user may perform a process for a component shield defect.

According to an embodiment, when the amount of current to the shield pad exceeds the threshold value in operation 2530, the electronic device 101 may, in operation 2540, connect the shield to the ground and restore the original state. The electronic device 101 may, for example, control a shield switch to electrically connect the shield to a ground layer.

Figure 26:
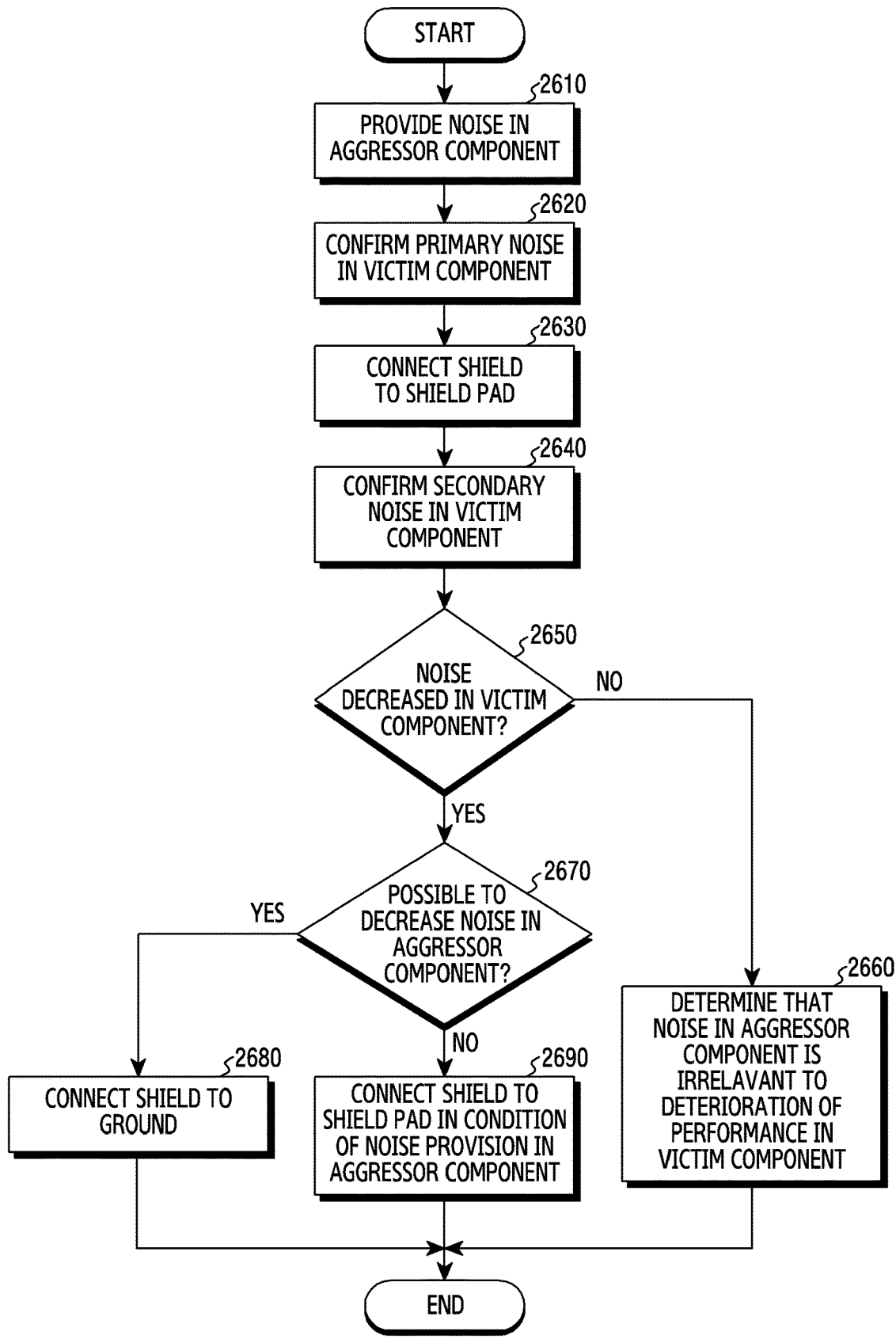
FIG. 26 is a flowchart illustrating an example operation of controlling a shield path in an electronic device according to various embodiments.

FIG. 26 is a diagram flowchart illustrating an example operation of controlling a shield path in an electronic device (e.g., the electronic device 101 of FIG. 1) according to various embodiments.

Referring to FIG. 26, in operation 2610, the electronic device 101 may provide a noise resulting from an operation of one or a plurality of aggressor components (e.g., the aggressor component 330 of FIG. 3). The noise provided from the aggressor component may affect an adjacent component, or a space with a shield can (e.g., the shield can 320 in FIG. 3) may serve as a waveguide in which air exists between metals and affect a spaced component.

In operation 2620, the electronic device 101 may confirm a primary noise in a victim component (e.g., the victim component 340 of FIG. 3). For example, when the performance of the victim component is deteriorated, it may be determined as the influence of noise. The victim component may be a component, which is affected by a noise resulting from an operation of the aggressor component, among spaced components other than adjacent components.

In operation 2630, the electronic device 101 may electrically connect a shield (e.g., the shield 1960 of FIG. 19, the shield 2050 of FIG. 20, or the shield 2150 of FIG. 21) of one of packages located between the aggressor component and the victim component, to a shield pad (e.g., the shield pad 1980 of FIG. 19, the shield pad 2080 of FIG. 20, or the shield pad 2180 of FIG. 21). The electronic device 101 may, for example, control a shield switch (e.g., the shield switch 1970 of FIG. 19, the shield switch 2060 of FIG. 20, or the shield switch 2160 of FIG. 21) to electrically connect the shield with the shield pad.

In operation 2640, the electronic device 101 may confirm a secondary noise in the victim component. The victim component may be a component, which is affected by a noise resulting from an operation of the aggressor component, among spaced components other than adjacent components.

In operation 2650, the electronic device 101 may determine whether the secondary noise (the noise confirmed in operation 2640) has been decreased compared to the primary noise (the noise confirmed in operation 2620). This may be achieved based on whether a current amount measured in the victim component due to the secondary noise has been decreased compared to a current amount measured in the victim component due to the primary noise.

According to an embodiment, when it is determined that the noise is not decreased in the victim component in operation 2650, the electronic device 101 may, in operation 2660, determine that the noise provided due to the operation of the aggressor component does not affect the victim component. For example, the electronic device 101 may confirm that the operation of the aggressor component is not related to the deterioration of the performance of the victim component.

According to an embodiment, when it is determined that the noise has been decreased in the victim component in operation 2650, the electronic device 101 may, in operation 2670, determine whether it is possible to decrease the noise in the aggressor component. When it is determined that it is possible to decrease the noise in the victim component, the electronic device 101 may, in operation 2680 of an embodiment, electrically connect the shield to a ground layer. The electronic device 101 may, for example, control the shield switch to electrically connect the shield to the ground layer.

However, when it is determined that it is not possible to decrease the noise in the victim component, the electronic device 101 may, in operation 2690 of an embodiment, connect the shield to the shield pad under a condition of noise provision in the aggressor component. The electronic device 101 may, for example, connect the shield to the shield pad, and control the shield switch to detect a noise.

According to an embodiment, when a plurality of packages are located between the aggressor component and the victim component, the operation of the flowchart of FIG. 26 may be repeated as many as the number of the plurality of packages, until the aggressor component and the victim component may be confirmed.

While the present disclosure has been particularly shown and described with reference to various example embodiments, it will be understood by those skilled in the art that various modifications in form and detail may be made therein without departing from the spirit and scope of the disclosure including the appended claims and their equivalents.

According to an example embodiment of the present disclosure, an electronic device (e.g., the electronic device 101 of FIG. 1) may include: a ground pad (e.g., the ground pad 410 of FIG. 4) and at least one shield pad (e.g., the shield pad 420 of FIG. 4) connected to a first printed circuit board (PCB) (e.g., the PCB 310 of FIG. 3), a plurality of ground layers laminated to be electrically connected to the ground pad by at least one via hole, at least one electronic device disposed on an uppermost surface on which the plurality of ground layers are laminated, a shield (e.g., the shield 430 of FIG. 4) disposed to cover the at least one device wherein the at least one device is not exposed to the outside, and at least one switch device (e.g., the shield switch 440 of FIG. 4) comprising a switch disposed on the uppermost surface of the laminated structure and including a first terminal electrically connected to the shield through a first conductor layer (e.g., the first conductor layer 470 of FIG. 4), a second terminal electrically connected to one of the plurality of ground layers through a second conductor layer (e.g., the second conductor layer 480 of FIG. 4), and a third terminal electrically connected to the shield pad through a third conductor layer (e.g., the third conductor layer 490 of FIG. 4), and configured to selectively connect the first terminal to the second terminal or the third terminal wherein the shield is connected to any one of the one ground layer or the shield pad.

According to an example embodiment of the present disclosure, the electronic device may further include a mold (e.g., the mold 450 of FIG. 4) filling an internal space of the shield covering the devices.

According to an example embodiment of the present disclosure, the electronic device may further include a processor (e.g., the CP 1010 of FIG. 10) electrically connected to the at least one switch device and configured to control a switching operation of the switch device.

According to an example embodiment of the present disclosure, the processor may be disposed on a second PCB.

According to an example embodiment of the present disclosure, the at least one device may include at least one of an inductor, capacitor (LC), a band pass filter (BPF), and a power amplifier (PA).

According to an example embodiment of the present disclosure, insulating layers may be disposed between the plurality of ground layers.

According to an example embodiment of the present disclosure, the at least one device may be electrically connected to the ground pad through the via hole.

According to an example embodiment of the present disclosure, an electronic device (e.g., the electronic device 101 of FIG. 1) may include: a ground pad (e.g., the ground pad 1410 of FIG. 14) connected to a printed circuit board (PCB) (e.g., the PCB 310 of FIG. 3), a plurality of ground layers laminated to be electrically connected to the ground pad by at least one via hole, at least one device disposed on an uppermost surface on which the plurality of ground layers are laminated, a shield (e.g., the shield 1440 of FIG. 14) electrically connected to at least one of the plurality of ground layers and covering the at least one device wherein the at least one device is not exposed to the outside, and a shield pad (e.g., the shield pad 1420 of FIG. 14) electrically connected to at least one of the plurality of ground layers by a via penetrating the plurality of ground layers in a vertical direction and filled with a conductive material.

According to an example embodiment of the present disclosure, the electronic device may further include a mold (e.g., the mold 1450 of FIG. 4) filling an internal space of the shield covering the devices.

According to an example embodiment of the present disclosure, the at least one component may include at least one of an inductor, capacitor (LC), a band pass filter (BPF), and a power amplifier (PA).

According to an example embodiment of the present disclosure, insulating layers may be disposed between the plurality of ground layers.

According to an example embodiment of the present disclosure, the at least one device may be electrically connected to the ground pad through the via hole.

According to an example embodiment of the present disclosure, an electronic device (e.g., the electronic device 101) may include: a ground pad (e.g., the ground pad 1510 of FIG. 15) and at least one shield pad (e.g., the shield pad 1520 of FIG. 15) connected to a printed circuit board (PCB) (e.g., the PCB 310 of FIG. 3), a plurality of ground layers laminated to be electrically connected to the ground pad by at least one via hole, at least one device disposed on an uppermost surface on which the plurality of ground layers are laminated, a shield (e.g., the shield 1530 of FIG. 15) electrically connected to at least one of the plurality of ground layers and covering the at least one device, wherein the at least one device is not exposed to the outside, a second via hole (e.g., the second via hole 1580 of FIG. 15) electrically connected to at least one of the plurality of ground layers by penetrating the plurality of ground layers in a vertical direction from the at least one first shield pad and filled with a conductive material, and a pillar (e.g., the pillar 1550 of FIG. 15) connected between the second via hole exposed on the uppermost surface and a second shield pad disposed on an upper surface of the shield.

According to an example embodiment of the present disclosure, the electronic device may further include a mold (e.g., the mold 1540 of FIG. 15) filling an internal space of the shield covering the devices.

According to an example embodiment of the present disclosure, the at least one component may include at least one of an inductor, capacitor (LC), a band pass filter (BPF), and a power amplifier (PA).

According to an example embodiment of the present disclosure, insulating layers may be disposed between the plurality of ground layers.

According to an example embodiment of the present disclosure, the at least one device may be electrically connected to the ground pad through the via hole.

According to an example embodiment of the present disclosure, an electronic device (e.g., the electronic device 101 of FIG. 1) may include: a ground pad (e.g., the ground pad 1610 of FIG. 16) and at least one shield pad (e.g., the shield pad 1620 of FIG. 16) connected a printed circuit board (PCB) (e.g., the PCB 310 of FIG. 3), a plurality of laminated ground layers electrically connected to the ground pad by at least one via hole, at least one device disposed on an uppermost surface on which the plurality of ground layers are laminated, a shield (e.g., the shield 1630 of FIG. 16) electrically connected to at least one of the plurality of ground layers and covering the at least one device, wherein the at least one device is not exposed to the outside, a second via hole (e.g., the second via hole 1680 of FIG. 16) electrically connected to at least one of the plurality of ground layers by penetrating the plurality of ground layers in a vertical direction from the at least one first shield pad and filled with a conductive material, and a wire bond (e.g., the wire bond 1650 of FIG. 16) connected between the second via hole exposed on the uppermost surface and a second shield pad disposed on an upper surface of the shield.

According to an example embodiment of the present disclosure, the electronic device may further include a mold (e.g., the mold 1640 of FIG. 16) filling an internal space of the shield covering the devices.

According to an example embodiment of the present disclosure, the at least one component may include at least one of an inductor, capacitor (LC), a band pass filter (BPF), and a power amplifier (PA).

Methods of embodiments described in claims or the present disclosure may be implemented in the form of hardware, software, or a combination of hardware and software.

When the methods are implemented in software, a computer-readable storage medium storing one or more programs (software modules) may be presented. The one or more programs stored in the computer-readable storage medium may be configured to be executable by one or more processors in an electronic device. The one or more programs may include instructions for allowing the electronic device to execute the methods of embodiments described in claims or the present disclosure.

These programs (software modules, software) may be stored in a random access memory, a non-volatile memory including a flash memory, a read only memory (ROM), an electrically erasable programmable ROM (EEPROM), a magnetic disc storage device, a compact disc ROM (CD-ROM), digital versatile discs (DVDs), other types of an optical storage device, or a magnetic cassette. Or, they may be stored in a memory including a combination of some or all of them. Also, each configuration memory may be included in plurality as well. The program may be stored in an attachable storage device that may be accessed through a communication network such as the Internet, an intranet, a local area network (LAN), a wide LAN (WLAN), a storage area network (SAN), or a communication network comprising a combination thereof. This storage device may be connected to a device implementing an embodiment of the present disclosure through an external port. Also, a separate storage device on the communication network may be connected to the device implementing the embodiment of the present disclosure as well.

Additional features may be specified by the appended dependent claims. Example implementations may be realized by including one or more features taken jointly and individually from any claim, in any and all permutations.

Examples described in the present disclosure may include non-limiting example implementations of components corresponding to one or more features specified by the appended independent claims, and these features (or their corresponding components) may, individually or in combination, contribute to improving one or more technical problems that may be inferred by an ordinary technician from the present disclosure.

One or more selected components of any one example described in the present disclosure may be combined with one or more selected components of one or more other examples described in the present disclosure, or may be alternatively combined with the features of the appended independent claims, to form an additional alternative example.

Additional example implementations may be realized by including one or more components taken jointly and individually, in any and all permutations of any herein described implementation. Still other example implementations may also be realized, by combining one or more features of the appended claims with selected one or more components of any herein described example implementations.

In forming such additional example implementations, some components of any example implementation described in the present disclosure may be omitted. One or more components that may be omitted are components that an ordinary technician would directly and clearly recognize as not being so essential to a function of the present technology in light of technical problems discernible from the present disclosure. The ordinary technician would recognize the point that, although these omitted components are replaced or removed, there is no need to modify other components or features of the further alternative example in order to compensate for the change. Accordingly, in accordance with the present technology, further example implementations may be included within the present disclosure, even if a selected combination of features and/or components thereof is not specifically mentioned.

Two or more physically separate components of any described example implementation may alternatively be incorporated into a single component, where their integration is possible, and when the same function is performed by the thus formed single component, their integration is possible. Additionally, a single component of any example implementation described in the disclosure may alternatively be implemented as two or more separate components that achieve the same function, where appropriate.

In specific embodiments of the present disclosure described above, component included in the disclosure have been expressed in the singular or plural form according to the presented specific embodiments. However, the singular or plural expression is appropriately selected for the context presented for description convenience's sake, and the present disclosure is not limited to the singular or plural component, and even if the component is expressed in the plural form, it may be configured in the singular form, or even if the component is expressed in the singular form, it may be configured in the plural form.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
a printed circuit board (PCB); and
a package disposed at the printed circuit board,
wherein the package comprises:
a ground pad and at least one shield pad connected the printed circuit board;
a laminated structure comprising a plurality of laminated ground layers electrically connected to the ground pad by at least one via hole;
at least one electronic component disposed at an uppermost surface of the laminated structure;
a shield covering the at least one electronic; and
at least one switch device comprising a switch disposed at the uppermost surface of the laminated structure,
wherein the at least one switch device comprises a first terminal electrically connected to the shield through a first conductor wiring, a second terminal electrically connected to at least one of the pluralities of ground layers through a second conductor wiring, and a third terminal electrically connected to the shield pad through a third conductor wiring, and
wherein the at least one switch device is configured to selectively connect the first terminal to the second terminal or the third terminal wherein the shield is connected to at least one of the at least one of the pluralities of ground layers or the shield pad.

2. The electronic device of claim 1, further comprising a mold filling an internal space of the shield covering the at least one electronic component.

3. The electronic device of claim 1, further comprising a processor electrically connected to the at least one switch device and configured to control a switching operation of the switch device.

4. The electronic device of claim 3, wherein the processor is disposed at a second PCB.

5. The electronic device of claim 1, wherein the at least one electronic component comprises at least one of an inductor-capacitor (LC), a band pass filter (BPF), and a power amplifier (PA).

6. The electronic device of claim 1, wherein insulating layers are disposed between the plurality of ground layers.

7. The electronic device of claim 1, wherein the at least one electronic component is electrically connected to the ground pad through the via hole.

8. An electronic device comprising
a ground pad connected to a printed circuit board (PCB);
a plurality of ground layers laminated to be electrically connected to the ground pad by at least one via hole;
at least one electronic component disposed at an uppermost surface of the plurality of laminated ground layers;
a shield electrically covering at least one electronic component
a shield pad electrically connected to at least one of the plurality of ground layers by a via penetrating the plurality of ground layers in a vertical direction and filled with a conductive material; and at least one switch device comprising a switch disposed at the uppermost surface of the plurality of laminated ground layers, wherein the at least one switch device comprises a first terminal electrically connected to the shield through a first a first conductor wiring, a second terminal electrically connected to at least one of the plurality of ground layers through layers through a second conductor wiring, and a third terminal electrically connected to the shield pad through a third conductor wiring, and wherein the at least one switch device is configured to selectively connect the first terminal to the second terminal or the third terminal wherein the shield is connected to at least one of the at least one of the plurality of ground layers or the shield pad.

9. The electronic device of claim 8, further comprising: a mold filling an internal space of the shield covering the at least one component.

10. The electronic device of claim 8, wherein the at least one component comprises at least one of an inductor-capacitor (LC), a band pass filter (BPF), and a power amplifier (PA).

11. The electronic device of claim 8, wherein insulating layers are disposed between the plurality of ground layers.

12. The electronic device of claim 8, wherein the at least one electronic component is electrically connected to the ground pad through the via hole.

13. An electronic device comprising:
a ground pad and at least one first shield pad connected to a printed circuit board (PCB);
a plurality of ground layers laminated to be electrically connected to the ground pad by at least one first via hole;
at least one electronic component disposed at an uppermost surface of the plurality of laminated ground layers;
a shield electrically connected to at least one of the pluralities of ground layers and covering the at least one electronic component; and
a pillar connected between a second via hole exposed on the uppermost surface and a second shield pad disposed at an upper surface of the shield,
wherein the second via hole is electrically connected to at least one of the pluralities of ground layers by penetrating the plurality of ground layers in a vertical direction from the at least one first shield pad and filled with a conductive material.

14. The electronic device of claim 13, further comprising a mold filling an internal space of the shield covering the at least one component.

15. The electronic device of claim 13, wherein the at least one electronic component comprises at least one of an inductor-capacitor (LC), a band pass filter (BPF), and a power amplifier (PA).

16. The electronic device of claim 13, wherein insulating layers are disposed between the plurality of ground layers.

17. The electronic device of claim 13, wherein the at least one electronic component is electrically connected to the ground pad through the via hole.

18. An electronic device comprising:
a ground pad and at least one first shield pad connected to a printed circuit board (PCB);
a plurality of ground layers laminated to be electrically connected to the ground pad by at least one first via hole;
at least one electronic component disposed at an uppermost surface of the plurality of laminated ground layers;
a shield electrically connected to at least one of the pluralities of ground layers and covering the at least one electronic component; and
a wire bond connected between a second via hole exposed on the uppermost surface and a second shield pad disposed at an upper surface of the shield,
wherein the second via hole is electrically connected to at least one of the pluralities of ground layers by penetrating the plurality of ground layers in a vertical direction from the at least one first shield pad and filled with a conductive material.

19. The electronic device of claim 18, further comprising: a mold filling an internal space of the shield covering the at least one component.

20. The electronic device of claim 18, wherein the at least one component comprises at least one of an inductor-capacitor (LC), a band pass filter (BPF), and a power amplifier (PA).

* * * * *